United States Patent
Fukushima et al.

(10) Patent No.: US 11,883,952 B2
(45) Date of Patent: Jan. 30, 2024

(54) ACTUATOR

(71) Applicant: THK CO., LTD., Tokyo (JP)

(72) Inventors: Katsuya Fukushima, Tokyo (JP); Masashi Ishii, Tokyo (JP); Hiroki Niwa, Tokyo (JP); Akira Suzuki, Tokyo (JP); Kazuto Oga, Tokyo (JP); Shogo Wakuta, Tokyo (JP); Satoshi Hara, Tokyo (JP); Shigeki Hayashi, Kawasaki (JP); Tomofumi Mizuno, Tokyo (JP)

(73) Assignee: THK CO., LTD., Tokyo (JP)

( * ) Notice: Subject to any disclaimer, the term of this patent is extended or adjusted under 35 U.S.C. 154(b) by 458 days.

(21) Appl. No.: 17/263,318

(22) PCT Filed: Aug. 1, 2019

(86) PCT No.: PCT/JP2019/030262
§ 371 (c)(1),
(2) Date: Jan. 26, 2021

(87) PCT Pub. No.: WO2020/027274
PCT Pub. Date: Feb. 6, 2020

(65) Prior Publication Data
US 2021/0162609 A1    Jun. 3, 2021

(30) Foreign Application Priority Data
Aug. 1, 2018   (JP) .................. 2018-144902

(51) Int. Cl.
*B25J 15/06*    (2006.01)
*H02K 11/30*   (2016.01)
*H02K 41/03*   (2006.01)

(52) U.S. Cl.
CPC .......... *B25J 15/0616* (2013.01); *H02K 11/30* (2016.01); *H02K 41/031* (2013.01)

(58) Field of Classification Search
CPC ....... B25J 15/0616; B25J 15/06; H02K 11/30; H02K 41/031; H02K 41/03; H05K 13/0409; H05K 13/082
See application file for complete search history.

(56) References Cited

U.S. PATENT DOCUMENTS

| | | | |
|---|---|---|---|
| 7,261,350 B2 * | 8/2007 | Isetani | B25J 15/0616 294/185 |
| 7,471,019 B2 * | 12/2008 | Motherway | H02K 41/031 310/15 |

(Continued)

FOREIGN PATENT DOCUMENTS

| | | |
|---|---|---|
| CN | 102647896 A | 8/2012 |
| CN | 103687469 A | 3/2014 |

(Continued)

OTHER PUBLICATIONS

International Search Report dated Oct. 21, 2019, issued in counterpart application No. PCT/JP2019/030262, w/ English translation (4 pages).

(Continued)

*Primary Examiner* — Stephen A Vu
(74) *Attorney, Agent, or Firm* — WHDA, LLP

(57) ABSTRACT

Provided is an actuator in which a load applied to a shaft and a workpiece is controlled. The actuator includes a support part that rotatably supports the shaft, a linear motion motor that moves the shaft in a direction of a central axis, a connecting member that is at least a part of a member connecting a mover of the linear motion motor and the support part, a strain gauge that detects strain of the connecting member, and a control device that controls the linear motion motor, based on the strain detected by the strain gauge.

6 Claims, 10 Drawing Sheets

(56) References Cited

U.S. PATENT DOCUMENTS

| | | | | |
|---|---|---|---|---|
| 7,484,782 B2* | 2/2009 | Rich | ................. | B65G 47/914 414/752.1 |
| 8,240,028 B2* | 8/2012 | Kanai | ................ | H05K 13/0413 29/739 |
| 8,550,523 B2* | 10/2013 | Rachkov | ............ | H05K 13/0413 294/185 |
| 2004/0042890 A1* | 3/2004 | Hirata | ................ | H05K 13/0413 414/752.1 |

FOREIGN PATENT DOCUMENTS

| | | |
|---|---|---|
| JP | 2004-88024 A | 3/2004 |
| JP | 2008-227402 A | 9/2008 |
| JP | 2009-016512 A | 1/2009 |
| JP | 2009-164347 A | 7/2009 |
| JP | 2012-174751 A | 9/2012 |
| JP | 2014-067860 A | 4/2014 |

OTHER PUBLICATIONS

Office Action dated Dec. 2, 2022, issued in counterpart TW Application No. 108127203, with English translation. (14 pages).
Office Action dated Sep. 15, 2021, issued in counterpart CN Application No. 201980050929.6, with English Translation. (20 pages).

* cited by examiner

[Fig. 1]
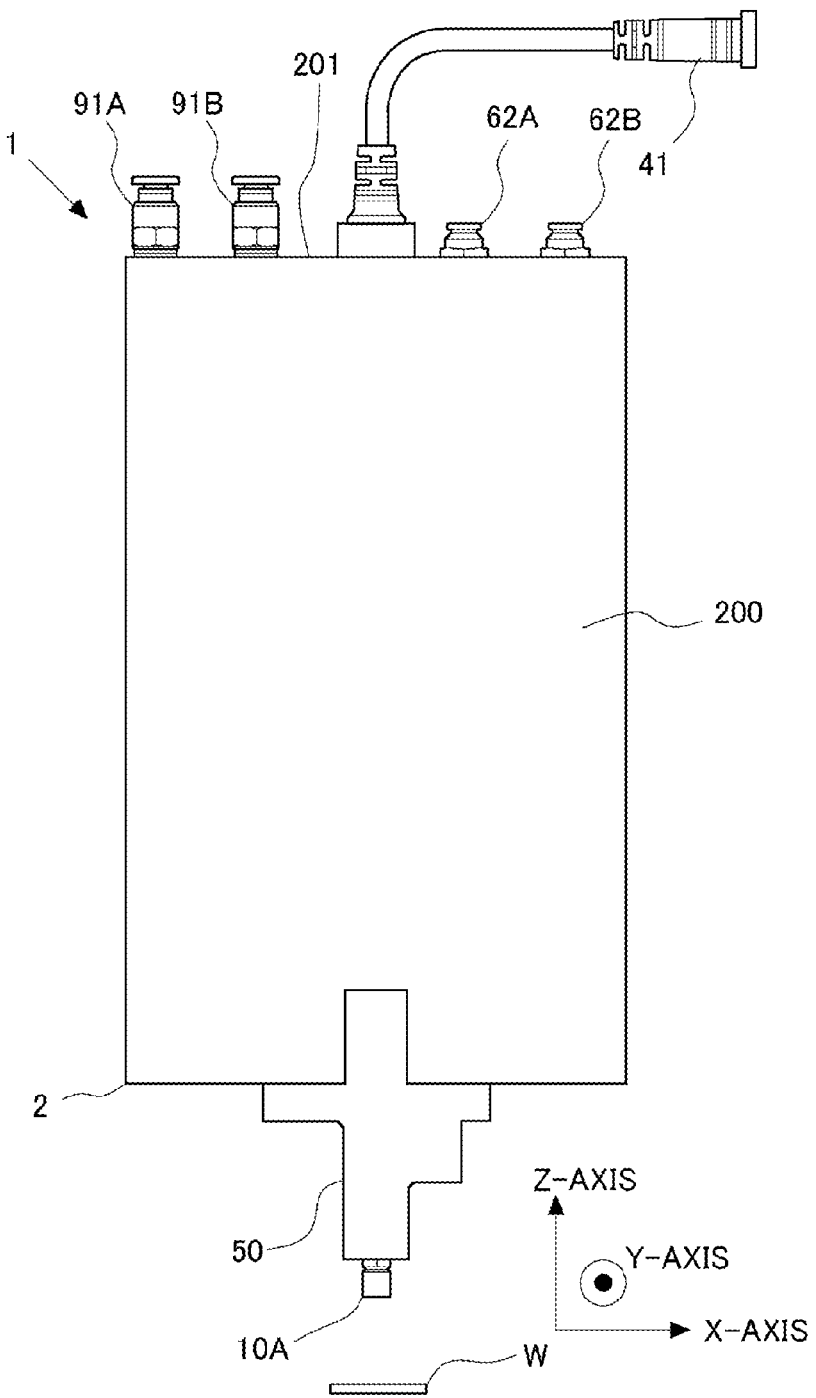

[Fig. 2]
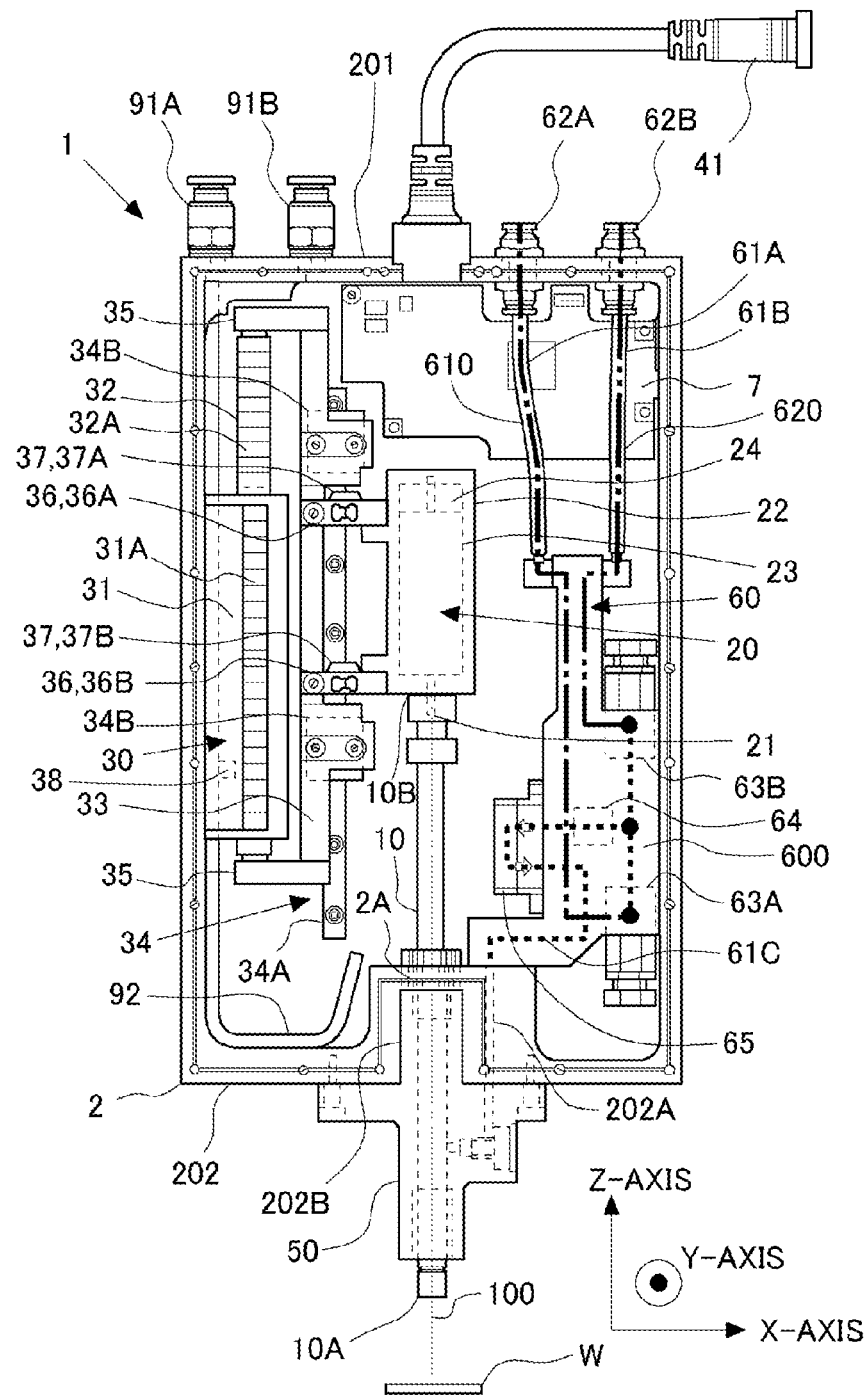

[Fig. 3]
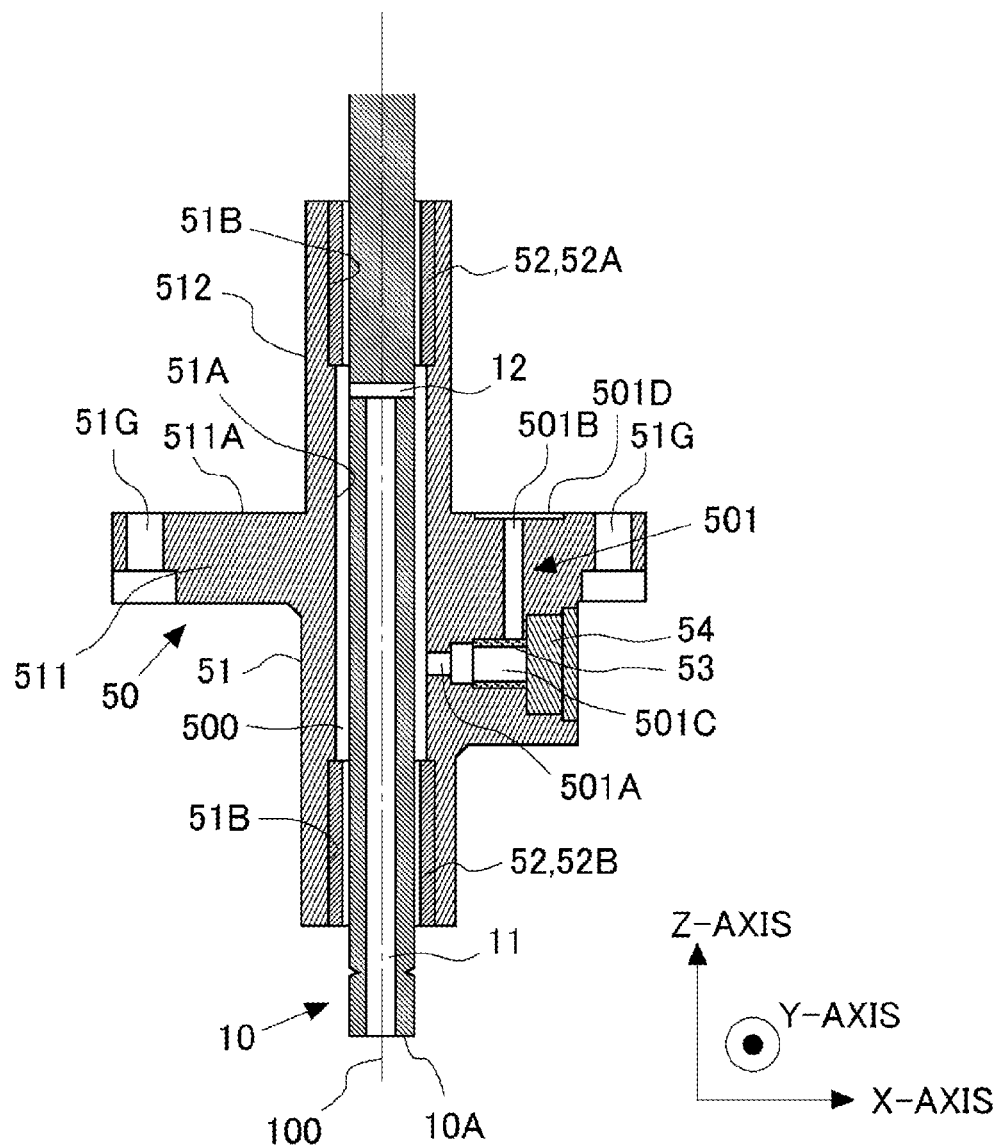

[Fig. 4]
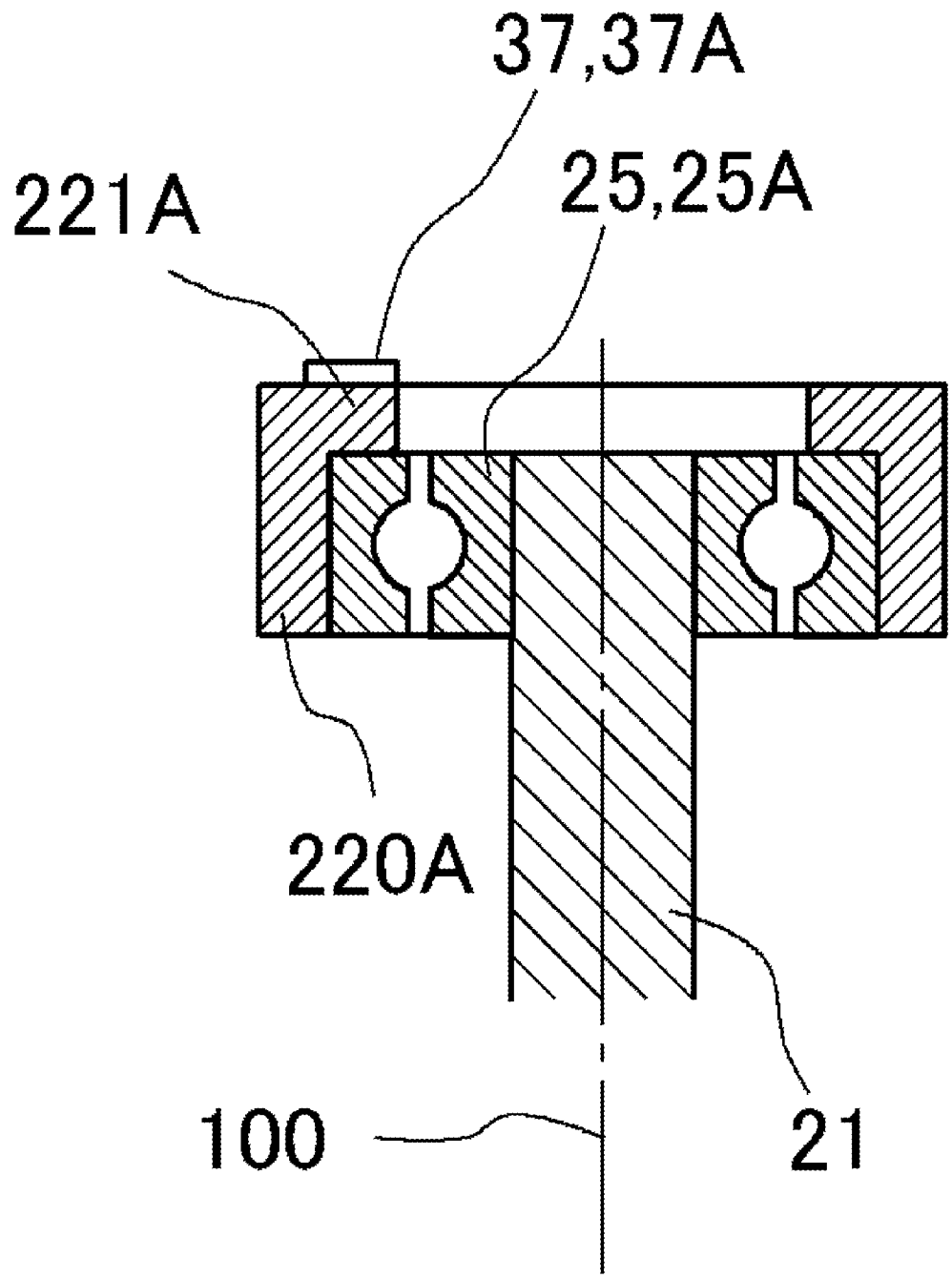

[Fig. 5]
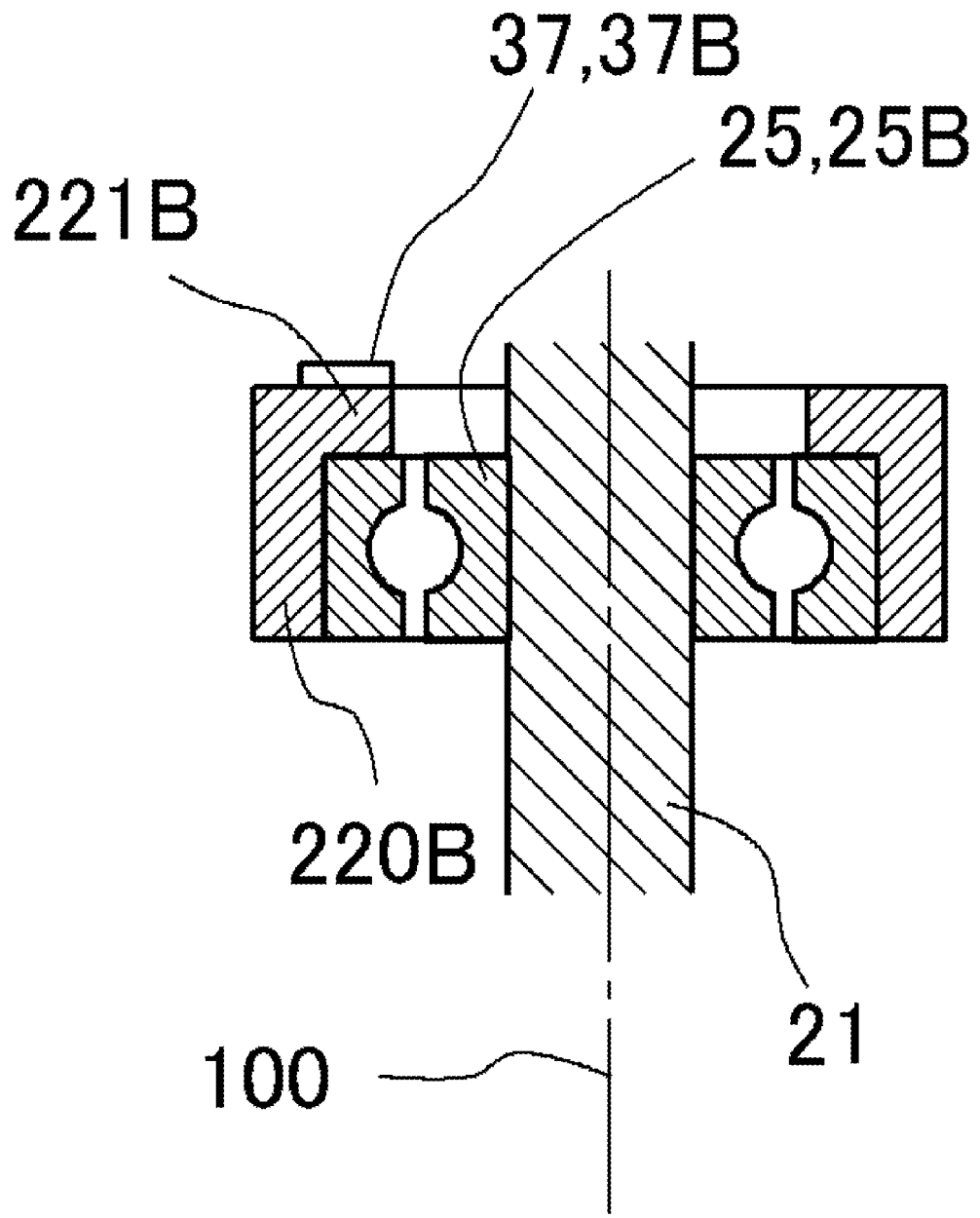

[Fig. 6]
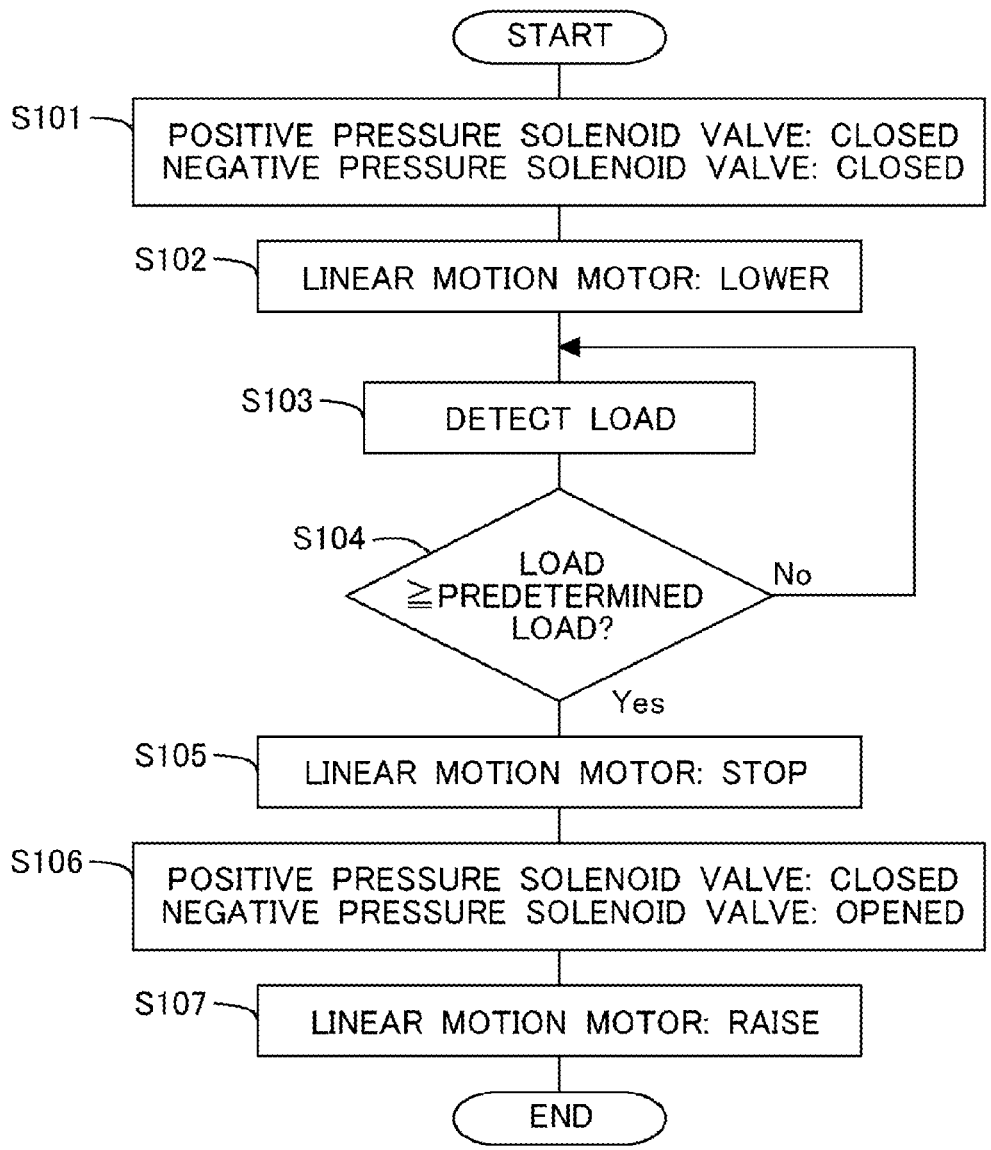

[Fig. 7]
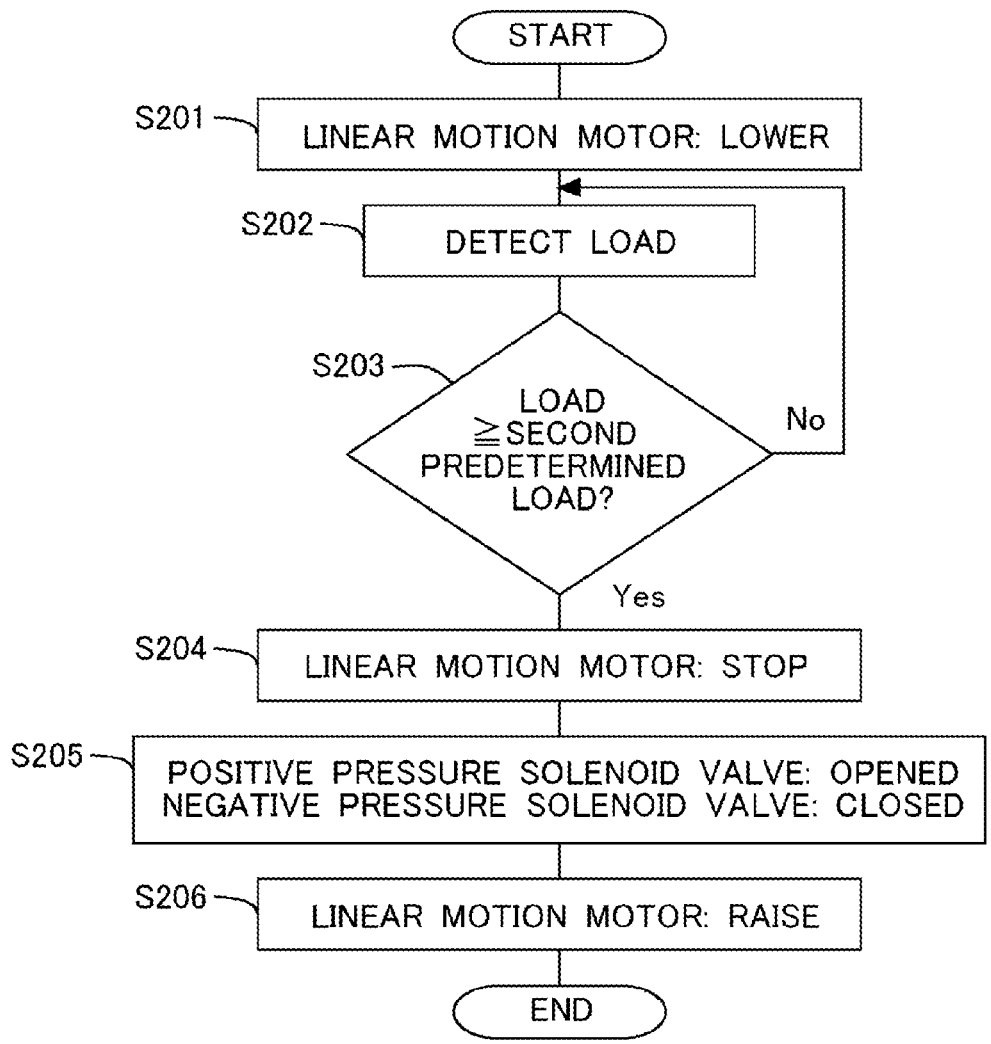

[Fig. 8]
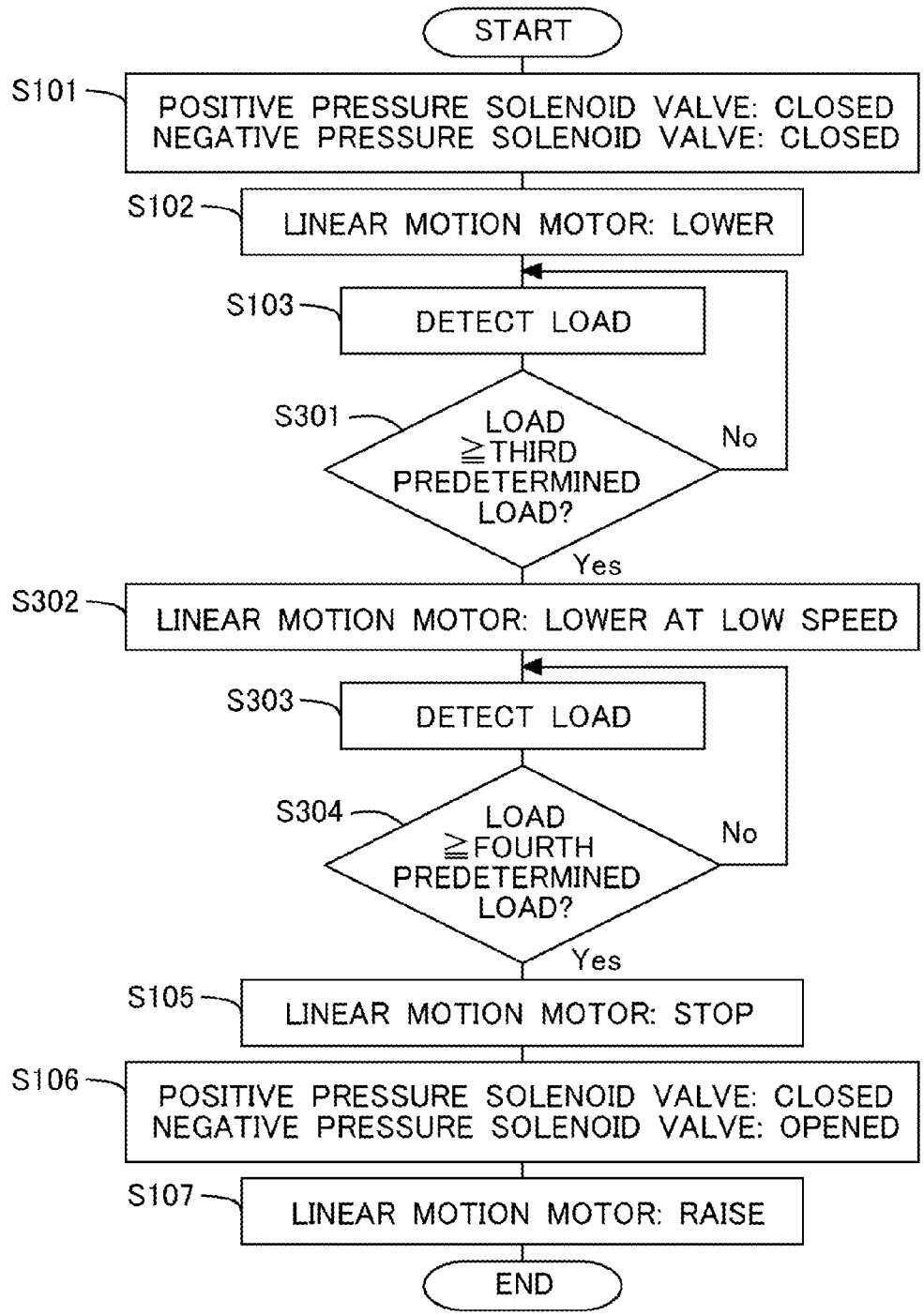

[Fig. 9]
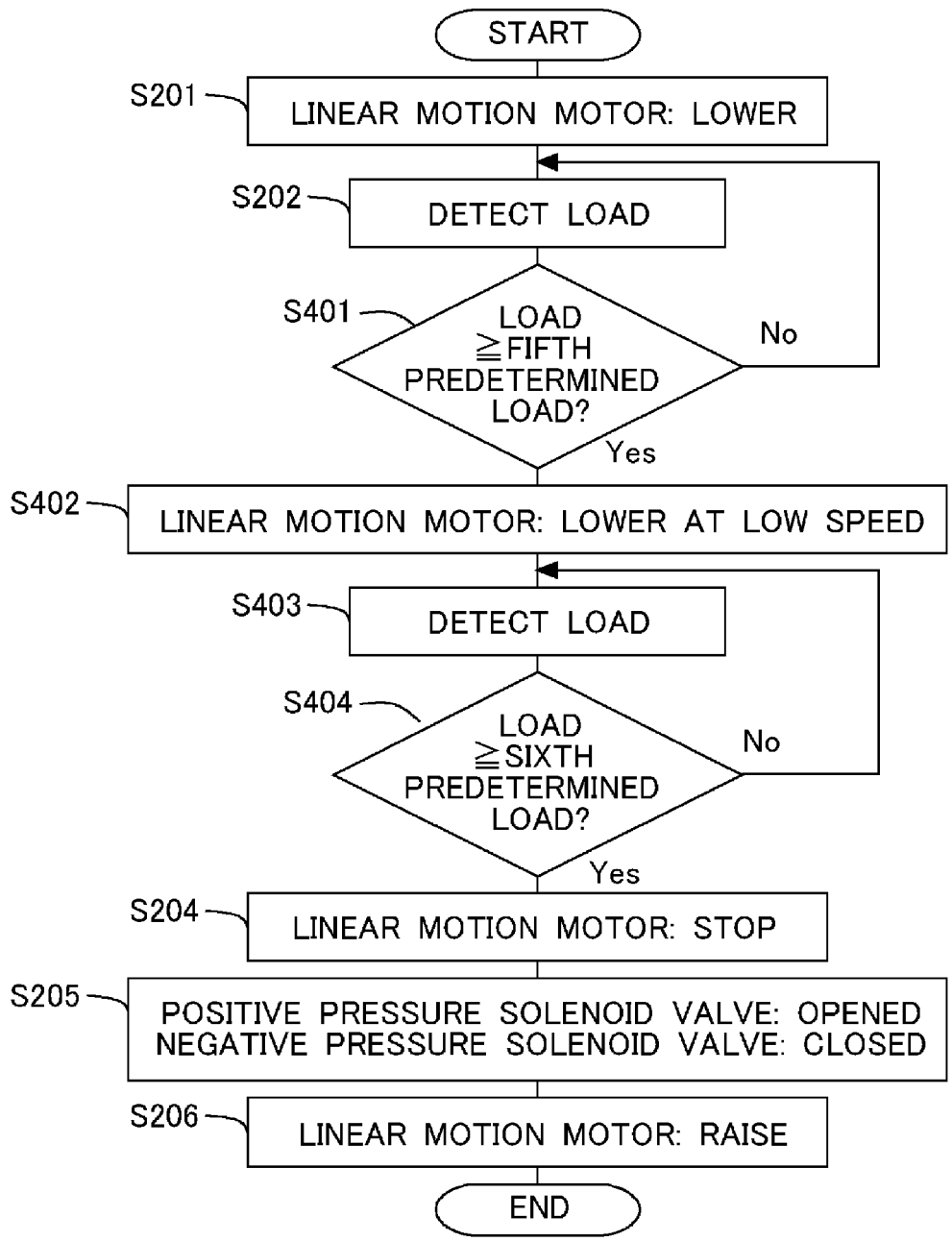

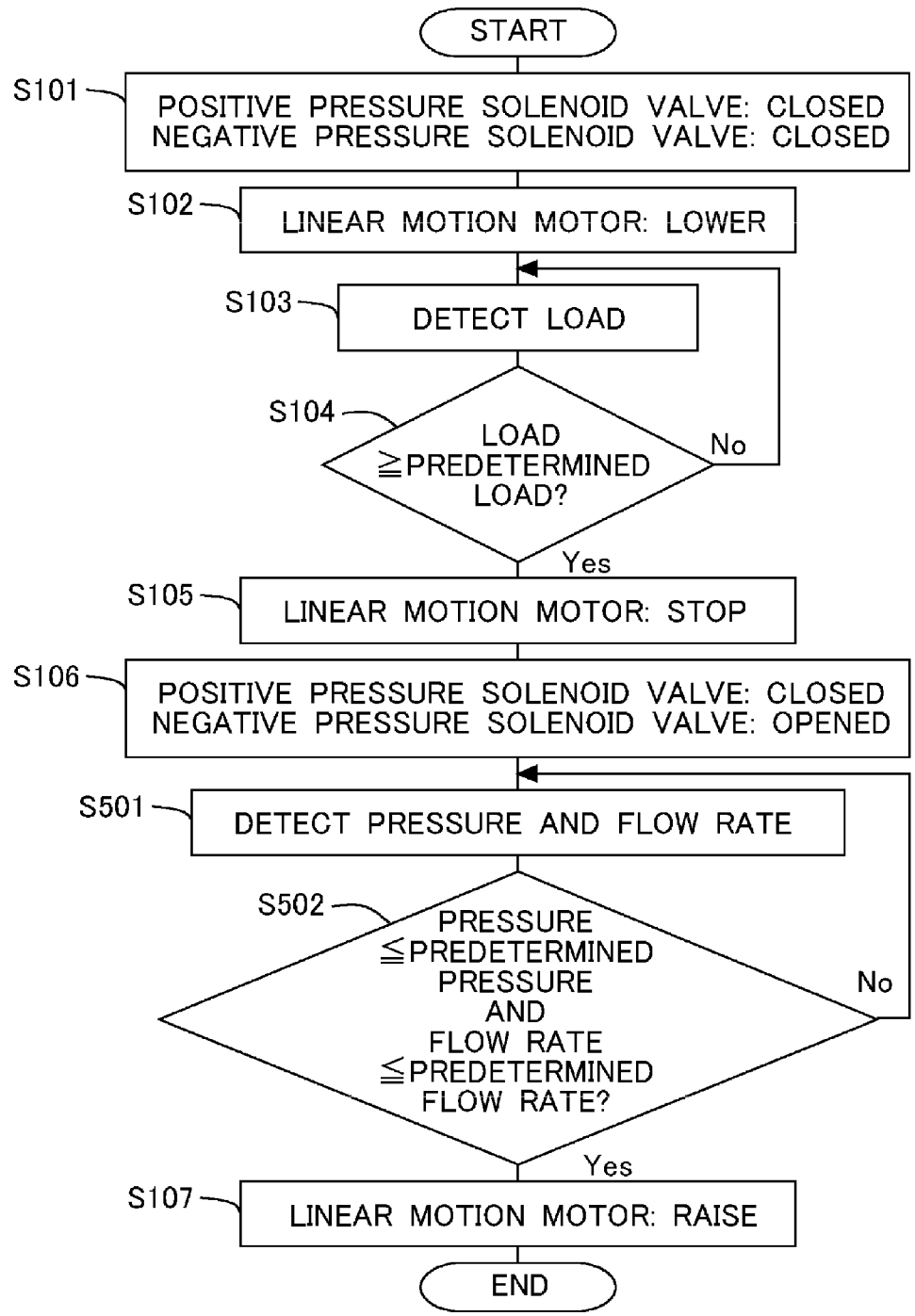
[Fig. 10]

ACTUATOR

TECHNICAL FIELD

The present invention relates to an actuator.

BACKGROUND ART

A workpiece can be sucked to a hollow shaft and picked up by providing a negative pressure to an interior of the shaft while the shaft is pressed against the workpiece. Here, if there is a space between the workpiece and the shaft when the workpiece is sucked to the shaft, the workpiece might strongly collide with the shaft and be damaged, or the workpiece could not be sucked. On the other hand, if a load to press the workpiece is excessively large, the workpiece might be damaged. Therefore, it is desirable to press the shaft against the workpiece with an appropriate load. Furthermore, if a speed of the shaft is high when the shaft comes in contact with the workpiece, the workpiece might be damaged due to the collision of the shaft with the workpiece. Therefore, it is desirable to reduce this impact. Heretofore, a chuck member has been provided to a tip of a shaft body via a cushioning member such as a spring (e.g., see Patent Literature 1). Specifically, the spring contracts to reduce the impact, when the chuck member comes in contact with the workpiece. Afterward, when the shaft further moves toward the workpiece, the workpiece is pressed with a load corresponding to a spring constant.

CITATION LIST

Patent Literature

[Patent Literature 1] Japanese Patent Laid-Open No. 2009-164347

SUMMARY OF INVENTION

Technical Problem

An appropriate load may vary with a workpiece. In a case where such a cushioning member as described above is provided, however, the load applied to the workpiece is determined in accordance with a spring constant. It is therefore difficult to change the load applied to the workpiece in accordance with the workpiece. If the load applied to the workpiece is adjusted with this configuration, for example, it is necessary to replace the cushioning member. Furthermore, if the cushioning member is provided as described above, the load applied to the workpiece tends to vary. Therefore, it is difficult to use the member in the workpiece for which it is necessary to accurately adjust the load. Here, if the load applied to a shaft and the workpiece can be detected, the shaft can be controlled in accordance with the detected load.

An object of the present invention, which has been made in view of various actual situations described above, is to provide an actuator in which a load applied to a shaft and a workpiece is controlled.

Solution to Problem

One of aspects of the present invention is an actuator comprising a shaft, a support part that rotatably supports the shaft, a linear motion motor including a stator and a mover, movement of the mover in parallel with a central axis of the shaft relative to the stator of the linear motion motor causing the support part and the shaft to move in a direction of the central axis of the shaft, a connecting member that is at least a part of a member connecting the mover of the linear motion motor and the support part, a strain gauge provided in the connecting member to detect strain of the connecting member, and a control device that controls the linear motion motor, based on the strain detected by the strain gauge.

Advantageous Effects of Invention

According to the present invention, in an actuator, a load applied to a shaft and a workpiece can be controlled.

BRIEF DESCRIPTION OF DRAWINGS

FIG. 1 is an appearance view of an actuator according to an embodiment.

FIG. 2 is a schematic configuration view illustrating an inner structure of the actuator according to the embodiment.

FIG. 3 is a cross-sectional view illustrating a schematic configuration including a shaft housing and a tip of a shaft according to the embodiment.

FIG. 4 is a view illustrating a schematic configuration in a case where a strain gauge is provided in a bearing that supports an output shaft of a rotating motor according to the embodiment.

FIG. 5 is a view illustrating a schematic configuration in the case where the strain gauge is provided in the bearing that supports the output shaft of the rotating motor according to the embodiment.

FIG. 6 is a flowchart illustrating flow of pickup processing according to a first embodiment.

FIG. 7 is a flowchart illustrating flow of place processing according to the first embodiment.

FIG. 8 is a flowchart illustrating flow of pickup processing according to a second embodiment.

FIG. 9 is a flowchart illustrating flow of place processing according to the second embodiment.

FIG. 10 is a flowchart illustrating flow of pickup processing according to a third embodiment.

MODE FOR CARRYING OUT THE INVENTION

In a load detector according to one of aspects of the present invention, a support part and a shaft are moved in a moving direction of a mover by a linear motion motor. The moving direction of the mover of the linear motion motor is parallel to a central axis direction of the shaft, and the linear motion motor is therefore driven to move the shaft in the central axis direction. An example of the linear motion motor is a linear motor. Furthermore, examples of the support part include a rotating motor that rotates the shaft, or a bearing provided between a stator of the rotating motor and an output shaft of the rotating motor. The mover of the linear motion motor is connected to the support part via a connecting member. Note that a plurality of connecting members may be present. Furthermore, the mover of the linear motion motor may be integrated with the connecting member, or the support part may be integrated with the connecting member. The support part rotatably supports the shaft regardless of the driving of the linear motion motor. Consequently, moving the shaft in the central axis direction by the linear motion motor, and rotating the shaft about a central axis can be performed individually.

If the shaft comes in contact with a workpiece by the driving of the linear motion motor, a load is generated between the shaft and the workpiece. Consequently, a force in a direction to move the shaft toward the workpiece acts on one end side (a linear motion motor side) of the connecting member, and a force in a direction to move the shaft away from the workpiece acts on the other end side (a support part side) of the connecting member, thereby generating strain in the connecting member. This strain has correlation with the load generated between the shaft and the workpiece. Therefore, detection of this strain by a strain gauge allows detection of the load applied to the shaft and the workpiece. Based on the load detected in this manner, the linear motion motor is controlled, so that appropriate load can be applied to the workpiece. It is therefore possible to more securely pick up the workpiece, while inhibiting damage on the workpiece.

Furthermore, the control device may detect a load applied to the shaft based on the strain detected by the strain gauge while the shaft is being moved by the linear motion motor, and may stop the linear motion motor in a case where the detected load is equal to or larger than a threshold. Note that the threshold is a load by which it is determined that the shaft comes in contact with the workpiece during the pickup of the workpiece. Furthermore, the threshold may be set as a load with which it is possible to more securely pick up the workpiece while inhibiting the damage on the workpiece during the pickup of the workpiece. Additionally, the threshold is, for example, a load by which it is determined that the workpiece is grounded or it is determined that the workpiece comes in contact with another member, during placing of the workpiece. In addition, the threshold may be set as a load with which it is possible to more securely press the workpiece against the other member while inhibiting the damage on the workpiece during the placing of the workpiece. The threshold can be changed in accordance with a type of workpiece. The linear motion motor is stopped in a case where the detected load is equal to or larger than the threshold, so that the shaft can be immediately stopped when the shaft comes in contact with the workpiece, or the shaft can be immediately stopped when the workpiece is grounded or comes in contact with the other member. Furthermore, it is possible to apply an appropriate load to the workpiece during the pickup or during the placing.

Additionally, the control device may detect a load applied to the shaft based on the strain detected by the strain gauge while the shaft is being moved by the linear motion motor, may set a speed at which the shaft is moved by the linear motion motor to a lower speed, in a case where the detected load is equal to or larger than a threshold than in a case where the load is less than the threshold, and may stop the linear motion motor, in a case where the detected load is equal to or larger than a second threshold indicating a load larger than the threshold. Note that the threshold is the load by which it is determined that the shaft comes in contact with the workpiece during the pickup of the workpiece. Furthermore, the threshold is, for example, the load by which it is determined that the workpiece is grounded or it is determined that the workpiece comes in contact with the other member, during the placing of the workpiece. Furthermore, the second threshold may be set as the load with which it is possible to more securely pick up the workpiece while inhibiting the damage on the workpiece during the pickup of the workpiece. Alternatively, the second threshold may be set as the load with which it is possible to more securely press the workpiece against the other member while inhibiting the damage on the workpiece during the placing of the workpiece. The threshold and the second threshold can be changed in accordance with the type of workpiece. Thus, the speed of the shaft is initially set to be high, and then the speed of the shaft is decreased after the shaft comes in contact with the workpiece during the pickup of the workpiece, or after the workpiece is grounded during the placing of the workpiece. Further load is applied to the workpiece while decreasing the speed of the shaft, and hence it is possible to more securely pick up the workpiece. Additionally, for example, in a case where the workpiece is bonded to the other member during the placing of the workpiece, the workpiece can be more appropriately bonded by applying the appropriate load. Furthermore, in a case where the load is less than the threshold, the shaft rapidly moves, and hence tact time can be shortened.

In addition, the shaft may include a hollow part formed on a tip side of the shaft such that an interior of the shaft is hollow, the actuator may further include a supply part that supplies a negative pressure to the hollow part, and the control device may supply the negative pressure from the supply part to the hollow part, after the linear motion motor is stopped, when a workpiece is to be picked up. Thus, the appropriate load is applied to the workpiece and then the negative pressure is supplied to the hollow part. Consequently, the damage on the workpiece due to the collision of the workpiece with the shaft can be inhibited. Furthermore, a space can be inhibited from being generated between the workpiece and the shaft, by pressing the shaft against the workpiece. Consequently, it is possible to more securely pick up the workpiece.

Furthermore, the shaft may include a hollow part formed on a tip side of the shaft such that an interior of the shaft is hollow, the actuator may further include a supply part that supplies a negative pressure to the hollow part, a flow sensor provided in a middle of an air passage to detect a flow rate of the air flowing through the air passage, the air passage being a passage through which air sucked from the hollow part when supplying the negative pressure to the hollow part flows, and a pressure sensor provided in a middle of the air passage, to detect a pressure in the air passage, and the control device may control the linear motion motor, based on, in addition to the strain detected by the strain gauge, the flow rate detected by the flow sensor and/or the pressure detected by the pressure sensor.

It can be detected that the shaft is in contact with the workpiece, based on the strain detected by the strain gauge. However, if the pressure in the hollow part is not sufficiently low even when the shaft is in contact with the workpiece, the workpiece might not be picked up, and the workpiece might drop halfway. Here, it can be determined whether or not the pressure in the hollow part sufficiently decreases, based on at least one of values of the flow rate detected by the flow sensor and the pressure detected by the pressure sensor. Consequently, it can be determined whether or not the workpiece is sucked to the shaft. That is, after the negative pressure is supplied to the hollow part, air flows through the air passage until the pressure in the hollow part sufficiently decreases. It is detected by the flow sensor that the air flows through this passage. Therefore, it can be determined, based on a detected value of the flow sensor, whether or not the pressure in the hollow part sufficiently decreases. Furthermore, the pressure in the air passage is also high (the negative pressure is small) until the pressure in the hollow part sufficiently decreases. Consequently, it can be determined, based on the detected value of the pressure sensor, whether or not the pressure in the hollow part sufficiently decreases. Therefore, the linear motion motor is controlled based on, in addition to the strain detected by the strain gauge, the flow rate detected by the flow sensor and/or the pressure detected by the pressure sensor. Consequently, it is possible to more securely pick up the workpiece.

The control device may supply the negative pressure from the supply part to the hollow part, when a workpiece is to be picked up, and may move the shaft upward in the central axis direction by the linear motion motor, when the flow rate detected by the flow sensor decreases down to a predetermined flow rate or less, and/or when the pressure detected by the pressure sensor decreases down to a predetermined pressure or less.

The flow of air through the air passage slows down as the pressure in the hollow part decreases (the negative pressure increases). Furthermore, the pressure of air in the air passage decreases as the pressure in the hollow part decreases. Therefore, it can be determined that the pressure in the hollow part sufficiently decreases, when the flow rate detected by the flow sensor decreases down to the predetermined flow rate or less and/or when the pressure detected by the pressure sensor decreases down to the predetermined pressure or less. Thereafter, the shaft is moved upward in the central axis direction, so that it is possible to more securely pick up the workpiece. Note that the predetermined flow rate is a flow rate at which the pressure in the hollow part decreases down to the pressure at which the workpiece can be picked up, and the predetermined pressure is a pressure to which the pressure in the hollow part decreases and at which the workpiece can be picked up.

Furthermore, the connecting member may include a first member and a second member that are provided in a shifted manner in a direction of the central axis of the shaft, and the strain gauge may be provided on each of surfaces that are provided on the first member and the second member, respectively, the surfaces facing in the same direction and being parallel to each other and orthogonal to the central axis of the shaft.

Here, the linear motion motor operates to generate heat. Furthermore, another device provided in the actuator may generate heat. Such heat may thermally expand the linear motion motor, the support part, and the connecting member. In this case, even if any load is not applied from the workpiece to the shaft, strain may be generated in the first member and the second member. For example, if there is a difference in temperature between a member to which the first member and the second member are connected on one end side and a member to which the members are connected on the other end side, a difference may be made in expansion amount. Note that hereinafter, the member to which the first member and the second member are connected on the one end side will be illustrated as a member having a large thermal expansion amount (a high expansion member), and the member to which the members are connected on the other end side will be illustrated as a member having a small thermal expansion amount (a low expansion member). In a case where the first member and the second member are connected to the high expansion member and the low expansion member in this manner, a distance between the first member and the second member may be larger on a high expansion member side than on a low expansion member side. Furthermore, forces in opposite directions are applied to the first member and the second member, respectively, in a direction to separate the first member and the second member on the high expansion member side. Consequently, strain in a contracting direction is generated in one of the surfaces that are provided on the first member and second member, respectively, face in the same direction and are parallel to each other and orthogonal to the central axis of the shaft, and strain in an expanding direction is generated on the other surface. In consequence, one of the strain gauge provided in the first member and the strain gauge provided in the second member has an output corresponding to the strain in the contracting direction, and the other strain gauge has an output corresponding to the strain in the expanding direction. At this time, the forces having the same magnitude are applied to the first member and the second member in the opposite directions, respectively, and hence the output of the one strain gauge and the output of the other strain gauge are different in positive or negative sign and have about the same absolute amount. Thus, the outputs of both the strain gauges are connected in parallel, so that influences of thermal expansion cancel each other. Consequently, it is not necessary to separately perform correction in accordance with a temperature. That is, the load applied only to the shaft and workpiece can be simply and accurately detected.

Hereinafter, modes for carrying out the present invention will be described with reference to the drawings. However, a dimension, material, shape, relative arrangement and the like of a component described in this embodiment do not restrict the scope of the invention unless otherwise described. Furthermore, the following embodiments can be combined as much as possible.

First Embodiment

FIG. 1 is an appearance view of an actuator 1 according to the present embodiment. The actuator 1 includes a housing 2 having a substantially rectangular parallelepiped outer shape, and a lid 200 is attached to the housing 2. FIG. 2 is a schematic configuration view illustrating an inner structure of the actuator 1 according to the present embodiment. A part of a shaft 10 is housed within the housing 2. The shaft 10 is formed to be hollow on a tip 10A side. In a material of the shaft 10 and the housing 2, for example, a metal (e.g., aluminum) may be used, or a resin or the like may be used. Note that in the following description, an XYZ orthogonal coordinate system will be set, and positions of respective members will be described with reference to this XYZ orthogonal coordinate system. A long side direction of the largest surface of the housing 2, i.e., a direction of a central axis 100 of the shaft 10 is a Z-axis direction, a short side direction of the largest surface of the housing 2 is an X-axis direction, and a direction that is orthogonal to the largest surface of the housing 2 is a Y-axis direction. The Z-axis direction is also a perpendicular direction. Note that hereinafter, an upper side in the Z-axis direction in FIG. 2 is an upper side of the actuator 1, and a lower side in the Z-axis direction in FIG. 2 is a lower side of the actuator 1. Furthermore, a right side in the X-axis direction in FIG. 2 is a right side of the actuator 1, and a left side in the X-axis direction in FIG. 2 is a left side of the actuator 1. Additionally, a front side in the Y-axis direction in FIG. 2 is a front side of the actuator 1, and a back side in the Y-axis direction in FIG. 2 is a back side of the actuator 1. The housing 2 is formed such that a dimension in the Z-axis direction is larger than a dimension in the X-axis direction, and a dimension in the X-axis direction is larger than a dimension in the Y-axis direction. In the housing 2, a region corresponding to one surface (a front surface in FIG. 2) orthogonal to the Y-axis direction is open, and this opening is closed with the lid 200. The lid 200 is fixed to the housing 2 with, for example, screws.

The housing 2 houses therein a rotating motor 20 that rotates the shaft 10 about the central axis 100, a linear motion motor 30 that moves the shaft 10 relatively straight in a direction along the central axis 100 (i.e., the Z-axis direction) relative to the housing 2, and an air control mechanism 60. Furthermore, a shaft housing 50 into which the shaft 10 is inserted is attached to a lower end face 202 of the housing 2 in the Z-axis direction. In the housing 2, a recess 202B is formed to be recessed from the lower end face 202 toward an interior of the housing 2, and a part of the shaft housing 50 is inserted into the recess 202B. A through hole 2A in the Z-axis direction is formed in an upper end of the recess 202B in the Z-axis direction, and the shaft 10 is inserted into the through hole 2A and the shaft housing 50. The tip 10A of the shaft 10 on the lower side in the Z-axis direction protrudes outward from the shaft housing 50. The shaft 10 is provided at a center of the housing 2 in the X-axis direction and a center of the housing in the Y-axis direction. That is, the shaft 10 is provided such that a central axis extending in the Z-axis direction through the center of the housing 2 in the X-axis direction and the center of the housing in the Y-axis direction is superimposed on the central axis 100 of the shaft 10. The shaft 10 is moved straight in the Z-axis direction by the linear motion motor 30, and is rotated about the central axis 100 by the rotating motor 20.

A base end 10B side of the shaft 10 that is an end on a side opposite to the tip 10A (an upper end in the Z-axis direction) is housed in the housing 2, and connected to an output shaft 21 of the rotating motor 20. The rotating motor 20 rotatably supports the shaft 10. A central axis of the output shaft 21 of the rotating motor 20 coincides with the central axis 100 of the shaft 10. The rotating motor 20 includes, in addition to the output shaft 21, a stator 22, a rotor 23 that rotates in the stator 22, and a rotary encoder 24 that detects a rotation angle of the output shaft 21. The rotor 23 rotates relative to the stator 22, and the output shaft 21 and the shaft 10 also rotate in conjunction with the stator 22.

The linear motion motor 30 includes a stator 31 fixed to the housing 2, and a mover 32 that relatively moves in the Z-axis direction relative to the stator 31. The linear motion motor 30 is, for example, a linear motor. The stator 31 is provided with a plurality of coils 31A, and the mover 32 is provided with a plurality of permanent magnets 32A. The coils 31A are arranged at a predetermined pitch in the Z-axis direction, and a plurality of sets of three coils 31A of U, V, and W-phases are provided. In the present embodiment, a three-phase armature current is applied to the coils 31A of the U, V, and W-phases to generate a straight moving magnetic field, and the mover 32 is straight moved relative to the stator 31. The linear motion motor 30 is provided with a linear encoder 38 that detects a relative position of the mover 32 to the stator 31. Note that in place of the above configuration, the stator 31 may be provided with a permanent magnet, and the mover 32 may be provided with a plurality of coils.

The mover 32 of the linear motion motor 30 is coupled to the stator 22 of the rotating motor 20 via a linear motion table 33. The linear motion table 33 is movable with movement of the mover 32 of the linear motion motor 30. The movement of the linear motion table 33 is guided in the Z-axis direction by a linear motion guide device 34. The linear motion guide device 34 includes a rail 34A fixed to the housing 2, and a slider block 34B attached to the rail 34A. The rail 34A is configured to extend in the Z-axis direction, and the slider block 34B is configured to be movable along the rail 34A in the Z-axis direction.

The linear motion table 33 is fixed to the slider block 34B, and is movable together with the slider block 34B in the Z-axis direction. The linear motion table 33 is coupled to the mover 32 of the linear motion motor 30 via two coupling arms 35. The two coupling arms 35 couple opposite ends of the mover 32 in the Z-axis direction to opposite ends of the linear motion table 33 in the Z-axis direction. Furthermore, the linear motion table 33 is coupled, on a central side of the opposite ends, to the stator 22 of the rotating motor 20 via two coupling arms 36. Note that the coupling arm 36 on the upper side in the Z-axis direction will be referred to as a first arm 36A, and the coupling arm 36 on the lower side in the Z-axis direction will be referred to as a second arm 36B. Furthermore, the first arm 36A and the second arm 36B will be referred to simply as the coupling arms 36 when the arms are not distinguished. For the stator 22 of the rotating motor 20, since the linear motion table 33 is coupled to the stator 22 of the rotating motor 20 via the coupling arms 36, the stator 22 of the rotating motor 20 also moves with the movement of the linear motion table 33. The coupling arm 36 has a quadrangular cross section. A strain gauge 37 is fixed to a surface of each coupling arm 36 which faces upward in the Z-axis direction. Note that the strain gauge 37 fixed to the first arm 36A will be referred to as a first strain gauge 37A, and the strain gauge 37 fixed to the second arm 36B will be referred to as a second strain gauge 37B. The first strain gauge 37A and the second strain gauge 37B will be referred to simply as the strain gauges 37 when the gauges are not distinguished. Note that two strain gauges 37 of the present embodiment are provided on surfaces of the coupling arms 36 which face upward in the Z-axis direction, respectively. In place of the surfaces, the gauges may be provided on surfaces of the coupling arm 36 that face downward in the Z-axis direction.

The air control mechanism 60 is a mechanism to generate a positive pressure or a negative pressure at the tip 10A of the shaft 10. That is, the air control mechanism 60 sucks air in the shaft 10 during pickup of a workpiece W, to generate the negative pressure at the tip 10A of the shaft 10. Consequently, the workpiece W is sucked to the tip 10A of the shaft 10. Furthermore, air is supplied into the shaft 10, to generate the positive pressure at the tip 10A of the shaft 10. Thus, the workpiece W is easily removed from the tip 10A of the shaft 10.

The air control mechanism 60 includes a positive pressure passage 61A (see a dashed chain line) through which positive pressure air flows, a negative pressure passage 61B (see a double-dashed chain line) through which negative pressure air flows, and a shared passage 61C (see a broken line) shared by the positive pressure air and the negative pressure air. The positive pressure passage 61A has one end connected to a positive pressure connector 62A provided on an upper end face 201 of the housing 2 in the Z-axis direction, and the positive pressure passage 61A has the other end connected to a solenoid valve for positive pressure (hereinafter, referred to as a positive pressure solenoid valve 63A). The positive pressure solenoid valve 63A is opened and closed by an after-mentioned controller 7. Note that the positive pressure passage 61A has one end portion constituted of a tube 610, and the other end portion constituted of a hole made in a block 600. The positive pressure connector 62A extends through the upper end face 201 of the housing 2 in the Z-axis direction, and the positive pressure connector 62A is connected to an external tube linked to an air discharging pump or the like.

The negative pressure passage 61B has one end connected to a negative pressure connector 62B provided on the upper end face 201 of the housing 2 in the Z-axis direction, and the negative pressure passage 61B has the other end connected to a solenoid valve for negative pressure (hereinafter, referred to as a negative pressure solenoid valve 63B). The negative pressure solenoid valve 63B is opened and closed by the after-mentioned controller 7. Note that the negative pressure passage 61B has one end portion constituted of a tube 620, and the other end portion constituted of a hole made in the block 600. The negative pressure connector 62B extends through the upper end face 201 of the housing 2 in the Z-axis direction, and the negative pressure connector 62B is connected to an external tube linked to an air sucking pump or the like.

The shared passage 61C is constituted of a hole made in the block 600. The shared passage 61C has one end branching into two to be connected to the positive pressure solenoid valve 63A and the negative pressure solenoid valve 63B, and the shared passage 61C has the other end connected to an air flow passage 202A that is a through hole formed in the housing 2. The air flow passage 202A communicates with the shaft housing 50. The negative pressure solenoid valve 63B is opened and the positive pressure solenoid valve 63A is closed, to communicate between the negative pressure passage 61B and the shared passage 61C, thereby generating the negative pressure in the shared passage 61C. Then, air is sucked from the shaft housing 50 through the air flow passage 202A. On the other hand, the positive pressure solenoid valve 63A is opened and the negative pressure solenoid valve 63B is closed, to communicate between the positive pressure passage 61A and the shared passage 61C, thereby generating the positive pressure in the shared passage 61C. Then, air is supplied into the shaft housing 50 through the air flow passage 202A. The shared passage 61C is provided with a pressure sensor 64 that detects a pressure of air in the shared passage 61C and a flow sensor 65 that detects a flow rate of air in the shared passage 61C.

Note that in the actuator 1 illustrated in FIG. 2, the positive pressure passage 61A and the negative pressure passage 61B have a part constituted of a tube, and the other part constituted of a hole made in the block 600. The present invention is not limited to this embodiment, and all the passages may be constituted of tubes, or all the passages may be constituted of holes made in the block 600. This also applies to the shared passage 61C, and the passage may be entirely constituted of a tube, or may be constituted by combined use of the tube. Note that a material of the tube 610 and the tube 620 may be a material such as a resin having flexibility, or may be a material such as a metal that does not have any flexibility. Furthermore, an atmospheric pressure may be supplied, instead of supplying the positive pressure to the shaft housing 50 by use of the positive pressure passage 61A.

Additionally, on the upper end face 201 of the housing 2 in the Z-axis direction, provided are a connector (hereinafter, referred to as an inlet connector 91A) that is an inlet of air for cooling the rotating motor 20 and a connector (hereinafter, referred to as an outlet connector 91B) that is an outlet of air from the housing 2. The inlet connector 91A and the outlet connector 91B extend through the upper end face 201 of the housing 2 so that air can flow through. A tube linked to an air discharge pump or the like is connected to the inlet connector 91A from outside the housing 2, and a tube that discharges air flowing out of the housing 2 is connected to the outlet connector 91B from outside the housing 2. The interior of the housing 2 is provided with a metal pipe (hereinafter, referred to as a cooling pipe 92) through which air for cooling the rotating motor 20 flows, and the cooling pipe 92 has one end connected to the inlet connector 91A. The cooling pipe 92 is formed to extend from the inlet connector 91A in the Z-axis direction to a vicinity of the lower end face 202 of the housing 2, and to curve in the vicinity of the lower end face 202 such that the pipe, at the other end, faces the rotating motor 20. Thus, air is supplied from the lower side in the Z-axis direction into the housing 2, thereby allowing efficient cooling. Furthermore, the cooling pipe 92 extends through the stator 31, to take heat from the coils 31A of the linear motion motor 30. The coils 31A are arranged around the cooling pipe 92, to take more heat from the coils 31A provided in the stator 31.

The upper end face 201 of the housing 2 in the Z-axis direction is connected to a connector 41 including a power supplying wire and a signal line. Furthermore, the housing 2 is provided with the controller 7. The wire or signal line pulled from the connector 41 into the housing 2 is connected to the controller 7. The controller 7 is provided with a central processing unit (CPU), a random access memory (RAM), a read only memory (ROM), and an erasable programmable ROM (EPROM), which are connected to one another via a bus. In the EPROM, various programs, various tables and others are stored. The program stored in the EPROM is loaded and executed in a work area of the RAM by the CPU, and through the execution of this program, the rotating motor 20, the linear motion motor 30, the positive pressure solenoid valve 63A, the negative pressure solenoid valve 63B and others are controlled. Thus, the CPU achieves a function that meets a predetermined purpose. Furthermore, output signals of the pressure sensor 64, the flow sensor 65, the strain gauge 37, the rotary encoder 24 and the linear encoder 38 are input into the controller 7. Note that the controller 7 does not have to entirely control the rotating motor 20, the linear motion motor 30, the positive pressure solenoid valve 63A, the negative pressure solenoid valve 63B and others, and another control equipment connected to the connector 41 may control some of these components. Alternatively, the program may be supplied from external control equipment to the controller 7 via the connector 41.

FIG. 3 is a cross-sectional view illustrating a schematic configuration including the shaft housing 50 and the tip 10A of the shaft 10. The shaft housing 50 includes a housing body 51, two rings 52, a filter 53, and a filter stop 54. In the housing body 51, a through hole 51A is formed into which the shaft 10 is inserted. The through hole 51A extends through the housing body 51 in the Z-axis direction, and an upper end of the through hole 51A in the Z-axis direction communicates with the through hole 2A formed in the housing 2. A diameter of the through hole 51A is larger than an outer diameter of the shaft 10. Consequently, a space is provided between an inner surface of the through hole 51A and an outer surface of the shaft 10. In opposite ends of the through hole 51A, enlarged parts 51B each having a hole diameter enlarged are provided. The rings 52 are fitted in two enlarged parts 51B, respectively. Each ring 52 is formed in a cylindrical shape, and an inner diameter of the ring 52 is slightly larger than the outer diameter of the shaft 10. Therefore, the shaft 10 is movable in the Z-axis direction in the ring 52. Consequently, a space is also formed between an inner surface of the ring 52 and the outer surface of the shaft 10. Therefore, the shaft 10 is movable in the Z-axis direction in the ring 52, and the shaft 10 is rotatable about the central axis 100 in the ring 52. However, the space formed between the inner surface of the ring 52 and the outer surface of the shaft 10 is smaller than the space formed between the inner surface of the through hole 51A excluding the enlarged parts 51B and the outer surface of the shaft 10. Note that the ring 52 on the upper side in the Z-axis direction will be referred to as a first ring 52A, and the ring 52 on the lower side in the Z-axis direction will be referred to as a second ring 52B. The first ring 52A and the second ring 52B will be referred to simply as the rings 52 when the rings are not distinguished. In a material of the ring 52, for example, a metal or a resin may be used.

A protrusion 511 protruding in opposite right and left directions in the X-axis direction is formed in a central part of the housing body 51 in the Z-axis direction. In the protrusion 511, a mounting surface 511A is formed which is a surface parallel to the lower end face 202 of the housing 2, the surface coming in contact with the lower end face 202, when the shaft housing 50 is mounted to the lower end face 202 of the housing 2. The mounting surface 511A is a surface orthogonal to the central axis 100. Furthermore, a part 512 that is a part of the shaft housing 50 on the upper side of the mounting surface 511A in the Z-axis direction is formed to fit in the recess 202B formed in the housing 2, when the shaft housing 50 is mounted to the housing 2.

The space is provided between the inner surface of the through hole 51A and the outer surface of the shaft 10 as described above. As a result, in the housing body 51, an inner space 500 is formed which is a space surrounded with the inner surface of the through hole 51A, the outer surface of the shaft 10, a lower end face of the first ring 52A, and an upper end face of the second ring 52B. Furthermore, in the shaft housing 50, a control passage 501 is formed which communicates between an opening of the air flow passage 202A formed in the lower end face 202 of the housing 2 and the inner space 500 to form an air passage. The control passage 501 includes a first passage 501A extending in the X-axis direction, a second passage 501B extending in the Z-axis direction, and a filter part 501C that is a space where the first passage 501A and the second passage 501B are connected and the filter 53 is disposed. The first passage 501A has one end connected to the inner space 500, and the other end connected to the filter part 501C. The second passage 501B has one end opened in the mounting surface 511A and aligned to be connected to the opening of the air flow passage 202A.

Furthermore, the second passage 501B has the other end connected to the filter part 501C. In the filter part 501C, the filter 53 formed in a cylindrical shape is provided. The filter part 501C is formed in a columnar space extending in the X-axis direction such that a central axis coincides with that of the first passage 501A. An inner diameter of the filter part 501C is substantially equal to an outer diameter of the filter 53. The filter 53 is inserted into the filter part 501C in the X-axis direction. After the filter 53 is inserted into the filter part 501C, an end of the filter part 501C which is an insertion port of the filter 53 is closed with the filter stop 54. The other end of the second passage 501B is connected to the filter part 501C from a side of an outer circumferential surface of the filter 53. Furthermore, the other end of the first passage 501A communicates with a central side of the filter 53. Therefore, air flowing through a space between the first passage 501A and the second passage 501B flows through the filter 53. Therefore, foreign matter is captured by the filter 53, even if the foreign matter is sucked together with air into the inner space 500, for example, when the negative pressure is generated at the tip 10A. In the one end of the second passage 501B, a groove 501D is formed to hold sealant.

In vicinities of opposite ends of the protrusion 511 in the X-axis direction, two bolt holes 51G are formed into which bolts are inserted, when the shaft housing 50 is fixed to the housing 2 by use of the bolts. The bolt holes 51G extend through the protrusion 511 in the Z-axis direction and opens in the mounting surface 511A.

A hollow part 11 is formed on the tip 10A side of the shaft 10 such that the shaft 10 is hollow. The hollow part 11 has one end opened at the tip 10A. Furthermore, at the other end of the hollow part 11, a communication hole 12 that communicates between the inner space 500 and the hollow part 11 in the X-axis direction is formed. The communication hole 12 is formed to communicate between the inner space 500 and the hollow part 11, in an entire range of a stroke when the shaft 10 is moved in the Z-axis direction by the linear motion motor 30. Therefore, the tip 10A of the shaft 10 communicates with the air control mechanism 60 through the hollow part 11, the communication hole 12, the inner space 500, the control passage 501, and the air flow passage 202A. Note that the communication hole 12 may be formed in the Y-axis direction in addition to the X-axis direction.

According to this configuration, the communication hole 12 always communicates between the inner space 500 and the hollow part 11, even if the shaft 10 is at any position in the Z-axis direction when the linear motion motor 30 is driven to move the shaft 10 in the Z-axis direction. Furthermore, the communication hole 12 always communicates between the inner space 500 and the hollow part 11, even if a rotation angle of the shaft 10 is any angle about the central axis 100 when the rotating motor 20 is driven to rotate the shaft 10 about the central axis 100. Therefore, a communication state between the hollow part 11 and the inner space 500 is maintained even if the shaft 10 is in any state, and hence the hollow part 11 always communicates with the air control mechanism 60. For that reason, air in the hollow part 11 is sucked through the air flow passage 202A, the control passage 501, the inner space 500, and the communication hole 12, if the positive pressure solenoid valve 63A is closed and the negative pressure solenoid valve 63B is opened in the air control mechanism 60, regardless of the position of the shaft 10. As a result, the negative pressure can be generated in the hollow part 11. That is, the negative pressure can be generated at the tip 10A of the shaft 10, and hence the workpiece W can be sucked to the tip 10A of the shaft 10. Note that the space is also formed between the inner surface of the ring 52 and the outer surface of the shaft 10 as described above. However, this space is smaller than a space that forms the inner space 500 (i.e., the space formed between the inner surface of the through hole 51A and the outer surface of the shaft 10). Thus, in the air control mechanism 60, the positive pressure solenoid valve 63A is closed and the negative pressure solenoid valve 63B is opened, so that a flow rate of air flowing through the space between the inner surface of the ring 52 and the outer surface of the shaft 10 can be suppressed, even if air is sucked from the inner space 500. Consequently, the negative pressure at which the workpiece W can be picked up can be generated at the tip 10A of the shaft 10. On the other hand, the positive pressure can be generated in the hollow part 11, if the positive pressure solenoid valve 63A is opened and the negative pressure solenoid valve 63B is closed in the air control mechanism 60, regardless of the position of the shaft 10. That is, since the positive pressure can be generated at the tip 10A of the shaft 10, the workpiece W can be quickly removed from the tip 10A of the shaft 10.

(Pick and Place Operation)

Description will be made as to pick and place of the workpiece W by use of actuator 1. The controller 7 executes a predetermined program to perform the pick and place. During the pickup of the workpiece W, the positive pressure solenoid valve 63A and the negative pressure solenoid valve 63B are both in a closed state, until the shaft 10 comes in contact with the workpiece W. In this case, the pressure of the tip 10A of the shaft 10 is the atmospheric pressure. Then, the linear motion motor 30 moves the shaft 10 downward in the Z-axis direction. Upon contact of the shaft 10 with the workpiece W, the linear motion motor 30 is stopped. After the linear motion motor 30 is stopped, the negative pressure solenoid valve 63B is opened to generate the negative pressure at the tip 10A of the shaft 10, thereby sucking the workpiece W to the tip 10A of the shaft 10. Afterward, the linear motion motor 30 moves the shaft 10 upward in the Z-axis direction. At this time, the shaft 10 is rotated by the rotating motor 20 as required. Thus, the workpiece W can be picked up.

Next, during the placing of the workpiece W, the shaft 10 in a state where the workpiece W is sucked to the tip 10A is moved downward in the Z-axis direction by the linear motion motor 30. If the workpiece W is grounded, the linear motion motor 30 is stopped, to stop the movement of the shaft 10. Furthermore, the negative pressure solenoid valve 63B is closed and the positive pressure solenoid valve 63A is opened, to generate the positive pressure in the tip 10A of the shaft 10. Afterward, the linear motion motor 30 moves the shaft 10 upward in the Z-axis direction, and the tip 10A of the shaft 10 accordingly leaves the workpiece W.

Here, during the pickup of the workpiece W, it is detected, using the strain gauge 37, that the tip 10A of the shaft 10 comes in contact with the workpiece W. Hereinafter, this method will be described. Note that it is similarly detected that the workpiece W is grounded during the placing of the workpiece W. If the tip 10A of the shaft 10 comes in contact with the workpiece W and the tip 10A pushes the workpiece W, a load is generated between the shaft 10 and the workpiece W. That is, the shaft 10 receives a force from the workpiece W due to reaction when the shaft 10 applies the force to the workpiece W. The force received from the workpiece W by the shaft 10 acts in a direction to generate strain relative to the coupling arm 36. That is, the strain is generated in the coupling arm 36 at this time. This strain is detected by the strain gauge 37. Then, the strain detected by the strain gauge 37 has correlation with the force received from the workpiece W by the shaft 10. Consequently, the force received from the workpiece W by the shaft 10, that is, the load generated between the shaft 10 and the workpiece W can be detected based on a detected value of the strain gauge 37. A relation between the detected value of the strain gauge and the load can be obtained beforehand by experiment, simulation or the like.

Thus, since the load generated between the shaft 10 and the workpiece W can be detected based on the detected value of the strain gauge 37, for example, it may be determined, upon the generation of the load, that the tip 10A of the shaft 10 comes in contact with the workpiece W, or it may be determined, in consideration of influence of error or the like, that the tip 10A of the shaft 10 comes in contact with the workpiece W in a case where a detected load is equal to or larger than a predetermined load. Note that the predetermined load is the load by which it is determined that the shaft 10 comes in contact with the workpiece W. Furthermore, the predetermined load may be set as the load with which it is possible to more securely pick up the workpiece W while inhibiting damage on the workpiece W. Additionally, the predetermined load can be changed in accordance with a type of workpiece W.

Here, change in resistance of the strain gauge 37 due to the strain is extremely small, and hence the change is taken as change in voltage by use of a Wheatstone bridge circuit. In the actuator 1, an output of a bridge circuit associated with the first strain gauge 37A and an output of a bridge circuit associated with the second strain gauge 37B are connected in parallel. Thus, the outputs of both the bridge circuits are connected in parallel, and accordingly the change in voltage is obtained, from which influence of temperature is eliminated as follows.

Here, assuming that there is not any strain of the coupling arm 36 due to the influence of temperature, the loads detected by the first strain gauge 37A and the second strain gauge 37B, respectively, are about the same. However, for example, in a case where operation frequency of the linear motion motor 30 is high and operation frequency of the rotating motor 20 is low, a temperature on a linear motion motor 30 side is higher than a temperature on a rotating motor 20 side. Therefore, an expansion amount in the Z-axis direction of the linear motion table 33 is larger than an expansion amount in the Z-axis direction of the rotating motor 20, between the first arm 36A and the second arm 36B. Consequently, the first arm 36A is not parallel to the second arm 36B, and a distance between the first arm 36A and the second arm 36B is larger on the linear motion motor 30 side than on the rotating motor 20 side. At this time, the first strain gauge 37A contracts, and the second strain gauge 37B expands. In this case, the output of the first strain gauge 37A apparently indicates the generation of the load, and the output of the second strain gauge 37B apparently indicates generation of a negative load. At this time, a force generated due to a difference between the expansion amount in the Z-axis direction of the linear motion table 33 and the expansion amount in the Z-axis direction of the rotating motor 20 is equally applied to the first arm 36A and the second arm 36B in opposite directions, and hence the output of the first strain gauge 37A and the output of the second strain gauge 37B have an equal absolute value and are different in positive or negative sign. For that reason, if the outputs of both the strain gauges are connected in parallel, the outputs due to the influence of temperature can cancel each other, and hence it is not necessary to separately perform correction in accordance with the temperature. Therefore, the load can be simply and accurately detected. Thus, the outputs of both the bridge circuits are connected in parallel, so that the change in voltage from which the influence of temperature is eliminated can be obtained, and this change in voltage has a value corresponding to the load generated between the shaft 10 and the workpiece W.

Note that in the present embodiment, two strain gauges 37 are provided, and instead of this, only one of the first strain gauge 37A or the second strain gauge 37B may be provided. In this case, the detected value of the strain gauge is corrected in accordance with the temperature by use of known technology. Even in a case where one strain gauge 37 is provided, the output of the strain gauge 37 has a value corresponding to the load generated between the shaft 10 and the workpiece W. Consequently, the load generated between the shaft 10 and the workpiece W can be detected based on the output of the strain gauge 37.

Thus, the strain gauges 37 are provided in the coupling arms 36, and hence it can be detected that the shaft 10 comes in contact with the workpiece W. Heretofore, it has been difficult to detect the force applied to the workpiece W. To solve this problem, an impact absorbing spring or a highly flexible member (e.g., a rubber) is attached to the tip 10A of the shaft 10. In this case, it is difficult to accurately adjust the force to be applied to the workpiece W. Furthermore, a speed at which the shaft 10 is brought close to the workpiece W may be decreased to reduce the impact generated when the shaft 10 abuts on the workpiece W. In this case, tact time lengthens. On the other hand, according to the actuator 1 of the present embodiment, it can be correctly detected by the strain gauge 37 that the shaft 10 comes in contact with the workpiece W, and hence the force to be applied to the workpiece W can be more accurately adjusted without decreasing the speed of the shaft 10.

Furthermore, an appropriate force can be applied to the workpiece W, and hence it is possible to more securely pick up the workpiece W. For example, when the workpiece W is picked up, the negative pressure is generated in the hollow part 11 in a state where the workpiece W is pressed against the tip 10A of the shaft 10. Consequently, it is possible to more securely pick up the workpiece W, and it is possible to inhibit the workpiece W from strongly colliding with the shaft 10 and being damaged when the workpiece W is sucked. On the other hand, if the load to press the workpiece W is excessively large, the workpiece W might be damaged. To solve this problem, an appropriate load is applied to the workpiece W while detecting the force to be applied to the workpiece W, so that it is possible to more securely pick up the workpiece W while inhibiting the damage on the workpiece W. Furthermore, also during the placing, it may be required to apply the appropriate load to the workpiece W. For example, it is necessary to apply a load in accordance with characteristics of bonding, in a case where the workpiece W is bonded to another member by use of adhesive. Also, at this time, appropriate control of the force to be applied to the workpiece W allows more secure bonding.

(Another Aspect 1 of Strain Gauge 37)

In the actuator 1, the strain gauge 37 is provided in the coupling arm 36. Alternatively, the strain gauge 37 may be provided in another member as long as the member generates strain in accordance with a load, when the load is generated between the shaft 10 and the workpiece W.

FIG. 4 and FIG. 5 are views illustrating a schematic configuration in a case where strain gauges 37 are provided in two bearings 25 supporting the output shaft 21 of the rotating motor 20, respectively. FIG. 4 is a view around a bearing 25A provided on the upper side in the Z-axis direction, and FIG. 5 is a view around a bearing 25B provided on the lower side in the Z-axis direction. Note that both the bearings will be referred to simply as bearings 25 when both the bearings are not distinguished. The bearings 25 are provided on the upper side (see FIG. 4) and the lower side (see FIG. 5), in the Z-axis direction, of the rotor 23 in the output shaft 21, respectively.

First, description will be made as to the strain gauge 37 provided on the upper side of the rotor 23 in the Z-axis direction with reference to FIG. 4. The bearing 25A has an inner circumferential surface fitted in an outer circumferential surface of the output shaft 21, and has an outer circumferential surface fitted in an inner circumferential surface of a fixing part 220A formed in the stator 22. The fixing part 220A includes an upper protrusion 221A protruding toward a central axis 100 side to come in contact with the bearing 25A on the upper side in the Z-axis direction. The first strain gauge 37A is provided on an upper surface of the upper protrusion 221A in the Z-axis direction.

Next, description will be made as to the strain gauge 37 provided on the lower side of the rotor 23 in the Z-axis direction with reference to FIG. 5. The bearing 25B has an inner circumferential surface fitted in the outer circumferential surface of the output shaft 21, and has an outer circumferential surface fitted in an inner circumferential surface of a fixing part 220B formed in the stator 22. The fixing part 220B includes a lower protrusion 221B protruding toward the central axis 100 side to come in contact with the bearing 25B on the upper side in the Z-axis direction. The second strain gauge 37B is provided on an upper surface of the lower protrusion 221B in the Z-axis direction.

Therefore, the first strain gauge 37A and the second strain gauge 37B are provided on the surfaces that face in the same direction and are parallel to each other and orthogonal to the central axis 100 of the shaft 10, respectively. According to this configuration, strain is generated in the upper protrusion 221A and the lower protrusion 221B due to the load generated between the shaft 10 and the workpiece W. This strain has correlation with the load generated between the shaft 10 and the workpiece W, and hence the detection of the strain by the strain gauge 37 allows detection of the load generated between the shaft 10 and the workpiece W. Furthermore, the first strain gauge 37A and the second strain gauge 37B detect strains in opposite directions due to the influence of temperature. That is, forces having the same magnitude are applied to the upper protrusion 221A and the lower protrusion 221B in opposite directions, in a case where there is a difference between an expansion amount of the stator 22 between the upper protrusion 221A and the lower protrusion 221B and an expansion amount of the output shaft 21. At this time, the output of the first strain gauge 37A and the output of the second strain gauge 37B have an equal absolute value and are different in positive or negative sign. Therefore, the outputs of both the strain gauges are connected in parallel, so that the outputs due to influence of temperature can cancel each other. Consequently, it is not necessary to separately perform correction in accordance with the temperature. In consequence, the load applied to the shaft 10 and the workpiece W can be easily and accurately detected.

(Another Aspect 2 of Strain Gauge 37)

In the actuator 1, the strain gauge 37 is provided in the coupling arm 36. Alternatively, the strain gauge 37 may be provided in the coupling arm 35. That is, the strain gauges 37 may be provided on surfaces of two coupling arms 35 which face upward in the Z-axis direction. Alternatively, the strain gauges 37 may be provided on surfaces of two coupling arms 35 which face downward in the Z-axis direction. Strain is generated in both an upward facing surface and a downward facing surface of the coupling arm 36 in the Z-axis direction in accordance with a magnitude of load generated between the shaft 10 and the workpiece W. Therefore, detection of this strain allows detection of the load. Furthermore, two coupling arms 35 are arranged in a shifted manner in the Z-axis direction, and include central axes parallel to each other, respectively, the respective central axes being orthogonal to the central axis 100 of the shaft 10. For that reason, outputs of two strain gauges are connected in parallel as described above, even in a case where strain is generated in the coupling arms 35 due to thermal expansion. Consequently, influence of the strain due to the thermal expansion can be canceled. In consequence, the load applied to the shaft 10 and the workpiece W can be easily and accurately detected.

(Pick and Place Control)

Next, specific control of pick and place will be described. The controller 7 executes the predetermined program, to perform this pick and place. Note that in the present embodiment, the output of the strain gauge 37 is replaced with the load, and the linear motion motor 30 is controlled based on this load. Instead of this, the linear motion motor 30 may be directly controlled based on the output of the strain gauge 37. First, pickup processing will be described. FIG. 6 is a flowchart illustrating flow of the pickup processing. The present flowchart is executed by the controller 7 every predetermined time. This predetermined time is set in accordance with tact time. In an initial state, the shaft 10 is at a sufficient distance from the workpiece W.

In step S101, the positive pressure solenoid valve 63A and the negative pressure solenoid valve 63B are both closed. That is, the pressure at the tip 10A of the shaft 10 is set to the atmospheric pressure. In step S102, the shaft 10 is lowered. That is, the linear motion motor 30 is driven to move the shaft 10 downward in the Z-axis direction. In step S103, the load applied to the shaft 10 is detected based on the output of the strain gauge 37. In step S104, it is determined whether or not the load applied to the shaft 10 is equal to or larger than the predetermined load. The predetermined load herein is the load by which it is determined that the shaft 10 comes in contact with the workpiece W. Note that the predetermined load may be set as the load with which it is possible to more securely pick up the workpiece W while inhibiting the damage on the workpiece W. If affirmative determination is made in the step S104, the processing advances to step S105, and if negative determination is made, the processing returns to the step S103. Therefore, the linear motion motor 30 moves the shaft 10 downward in the Z-axis direction until the load applied to the shaft 10 reaches the predetermined load or more.

In the step S105, the linear motion motor 30 is stopped. Note that even if the linear motion motor 30 is stopped, energization to the linear motion motor 30 is feedback controlled such that the predetermined load is continuously applied to the shaft 10.

In step S106, the negative pressure solenoid valve 63B is opened. Note that a closed valve state of the positive pressure solenoid valve 63A is maintained. Consequently, the negative pressure is generated at the tip 10A of the shaft 10, to suck the workpiece W to the tip 10A of the shaft 10. In step S107, the shaft 10 is raised. At this time, the linear motion motor 30 moves the shaft 10 by a predetermined distance upward in the Z-axis direction. At this time, the shaft 10 may be rotated by the rotating motor 20 as required. Thus, the workpiece W can be picked up.

Next, place processing will be described. FIG. 7 is a flowchart illustrating flow of the place processing. The place processing is executed by the controller 7, after the pickup processing illustrated in FIG. 6. At start of the place processing, the workpiece W is sucked to the tip of the shaft 10. That is, the positive pressure solenoid valve 63A is closed, and the negative pressure solenoid valve 63B is opened. In step S201, the shaft 10 is lowered. That is, the linear motion motor 30 is driven to move the shaft 10 downward in the Z-axis direction. In step S202, the load applied to the shaft 10 is detected based on the output of the strain gauge 37. In step S203, it is determined whether or not the load applied to the shaft 10 is equal to or larger than a second predetermined load. Note that the second predetermined load is the load by which it is determined that the workpiece W is grounded, or the load by which it is determined that the workpiece W comes in contact with another member. The second predetermined load may be the same as or different from the predetermined load in the step S104. If affirmative determination is made in the step S203, the processing advances to step S204, and if negative determination is made, the processing returns to the step S202. Therefore, the linear motion motor 30 moves the shaft 10 downward in the Z-axis direction until the load applied to the shaft 10 reaches the second predetermined load or more.

In the step S204, the linear motion motor 30 is stopped. Note that even if the linear motion motor 30 is stopped, the energization to the linear motion motor 30 is feedback controlled such that the second predetermined load is continuously applied to the shaft 10.

In step S205, the positive pressure solenoid valve 63A is opened, and the negative pressure solenoid valve 63B is closed. Consequently, the positive pressure is generated at the tip 10A of the shaft 10, to remove the workpiece W from the shaft 10. In step S206, the shaft 10 is raised. That is, the linear motion motor 30 moves the shaft 10 by a predetermined distance upward in the Z-axis direction. At this time, the shaft 10 may be rotated by the rotating motor 20 as required. Thus, the workpiece W can be placed.

As described above, according to the actuator 1 of the present embodiment, the load applied to the shaft 10 can be detected based on the output of the strain gauge 37. Then, the linear motion motor 30 is controlled based on the detected load, so that appropriate load can be applied to the workpiece W. Therefore, it is possible to more securely pick up the workpiece W while inhibiting damage on the workpiece W.

Second Embodiment

Here, if a linear motion motor 30 is stopped at a moment when a shaft 10 comes in contact with a workpiece W in pickup processing, a tip 10A of the shaft 10 does not come in contact sufficiently closely with the workpiece W, and a space may be generated between a part of the tip 10A of the shaft 10 and the workpiece W. If a negative pressure is generated in the tip 10A in this state, the workpiece W moves toward the tip 10A, and the workpiece W collides with the tip 10A in a region where there is the space between the tip 10A and the workpiece W. Due to this collision, the workpiece W might be damaged. Furthermore, if there is a space between a part of the tip 10A of the shaft 10 and the workpiece W, air flows into an inner space 500 from outside the shaft 10. Consequently, a pressure in the inner space 500 does not sufficiently decrease, and the workpiece W may not be picked up. Therefore, it is desirable that the whole tip 10A of the shaft 10 is in contact closely with the workpiece W. For that reason, it is considered that during the pickup processing, the shaft 10 is pressed against the workpiece W until a certain degree of load is applied to the workpiece W.

However, if a moving speed of the shaft 10 is excessively high in the pickup processing and the linear motion motor 30 is to be stopped, the linear motion motor 30 may not be immediately stopped due to a factor such as response delay. In this case, more load than necessary is applied to the workpiece W, and the workpiece W might be damaged. On the other hand, if the moving speed of the shaft 10 is decreased, tact time may increase.

To solve the program, in the present embodiment, the shaft 10 is moved at a comparatively high speed until the shaft 10 comes in contact with the workpiece W. After the shaft 10 comes in contact with the workpiece W, the shaft 10 is moved at a comparatively low speed until appropriate load is applied to the workpiece W. Consequently, the shaft 10 is more securely brought into contact closely with the workpiece W while inhibiting the damage on the workpiece W.

This pickup processing will be described. FIG. 8 is a flowchart illustrating flow of pickup processing. The present flowchart is executed by a controller 7 every predetermined time. This predetermined time is set in accordance with the tact time. Note that a step in which the same processing as the pickup processing illustrated in FIG. 6 is performed is denoted with the same reference numeral or symbol and description is omitted.

In the flowchart illustrated in FIG. 8, if processing of step S103 ends, the processing advances to step S301. In the step S301, it is determined whether or not load applied to the shaft 10 is equal to or larger than a third predetermined load. The third predetermined load is a load by which it is determined that the shaft 10 comes in contact with the workpiece W. In the present step S301, it is determined whether or not the shaft 10 comes in contact with the workpiece W. If affirmative determination is made in the step S301, the processing advances to step S302, and if negative determination is made, the processing returns to the step S103. Therefore, the linear motion motor 30 moves the shaft 10 downward in a Z-axis direction at a comparatively high speed until the load applied to the shaft 10 reaches the third predetermined load or more. In the step S302, the moving speed of the shaft 10 is decreased. That is, the speed at which the linear motion motor 30 moves the shaft 10 downward in the Z-axis direction is decreased. At this time, the moving speed decreases below the moving speed of the shaft 10 set in step S102.

In step S303, the load applied to the shaft 10 is detected based on an output of a strain gauge 37. In step S304, it is determined whether or not the load applied to the shaft 10 is equal to or larger than a fourth predetermined load. The fourth predetermined load is a load with which it is possible to more securely pick up the workpiece W while inhibiting the damage on the workpiece W. If affirmative determination is made in the step S304, the processing advances to step S105, and if negative determination is made, the processing returns to the step S303. Therefore, the linear motion motor 30 moves the shaft 10 downward in the Z-axis direction at a low speed until the load applied to the shaft 10 reaches the fourth predetermined load or more. Thus, it is possible to more securely pick up the workpiece W while inhibiting the damage on the workpiece W.

Similar control is possible also in place processing. FIG. 9 is a flowchart illustrating flow of place processing. The place processing is executed by the controller 7 after the pickup processing illustrated in FIG. 6 or FIG. 8. Note that a step in which the same processing as the place processing illustrated in FIG. 7 is performed is denoted with the same reference numeral or symbol and description is omitted.

In the flowchart illustrated in FIG. 9, if processing of step S202 ends, the processing advances to step S401. In the step S401, it is determined whether or not the load applied to the shaft 10 is equal to or larger than a fifth predetermined load. Note that the fifth predetermined load is a load by which it is determined that the workpiece W is grounded, or a load by which it is determined that the workpiece W comes in contact with another member. If affirmative determination is made in the step S401, the processing advances to step S402, and if negative determination is made, the processing returns to the step S202. Therefore, the linear motion motor 30 moves the shaft 10 downward in the Z-axis direction at a comparatively high speed until the load applied to the shaft 10 reaches the fifth predetermined load or more.

In the step S402, the moving speed of the shaft 10 is decreased. That is, the speed at which the linear motion motor 30 moves the shaft 10 downward in the Z-axis direction is decreased. At this time, the moving speed decreases below the moving speed of the shaft 10 set in step S201. In step S403, the load applied to the shaft 10 is detected based on the output of the strain gauge 37. In step S404, it is determined whether or not the load applied to the shaft 10 is equal to or larger than a sixth predetermined load. The sixth predetermined load is a load with which the workpiece W can be appropriately pressed against another member. If affirmative determination is made in the step S404, the processing advances to step S204, and if negative determination is made, the processing returns to the step S403. Therefore, the linear motion motor 30 moves the shaft 10 downward in the Z-axis direction at a low speed until the load applied to the shaft 10 reaches the sixth predetermined load or more. Thus, the workpiece W can be more securely pressed against an object while inhibiting the damage on the workpiece W.

As described above, according to an actuator 1 of the present embodiment, the speed of the shaft 10 is first set to be high. After the shaft 10 comes in contact with the workpiece W during pickup of the workpiece W, or after the workpiece W is grounded during placing of the workpiece W, the speed of the shaft 10 is decreased. The speed of the shaft 10 is decreased, while load applied to the workpiece W is further increased. Therefore, it is possible to more securely pick up the workpiece W. Furthermore, for example, appropriate load is applied in a case where the workpiece W is bonded to the other member during placing of the workpiece W. Consequently, the workpiece W can be more appropriately bonded. Additionally, the shaft 10 moves at a high speed until the shaft 10 comes in contact with the workpiece W, and hence tact time can be shortened.

Third Embodiment

In the above embodiment, after the linear motion motor 30 is stopped, the negative pressure solenoid valve 63B is opened. Consequently, the negative pressure is generated in the tip 10A of the shaft 10, to suck the workpiece W to the tip 10A of the shaft 10. However, it is not determined whether or not the workpiece W is actually sucked to the tip 10A of the shaft 10. Therefore, there might be failure in pickup of the workpiece W. To solve the problem, in the present embodiment, it is determined whether or not pressure in a hollow part 11 sufficiently decreases, before the shaft 10 is moved upward in a Z-axis direction to pick up the workpiece W. If the pressure in the hollow part 11 is sufficiently low, it can be determined that the workpiece W is sucked to the tip 10A of the shaft 10, and that it is possible to pick up the workpiece W. Then, if the pressure in the hollow part 11 sufficiently decreases, the linear motion motor 30 moves the shaft 10 upward in the Z-axis direction.

It is determined whether or not the pressure in the hollow part 11 sufficiently decreases, by using a detected value of at least one of a pressure sensor 64 and a flow sensor 65. After the shaft 10 comes in contact with the workpiece W, a positive pressure solenoid valve 63A is closed, and a negative pressure solenoid valve 63B is opened. Then, a negative pressure is generated in a shared passage 61C. The tip 10A of the shaft 10 communicates with the shared passage 61C through the hollow part 11, a communication hole 12, an inner space 500, a control passage 501, and an air flow passage 202A. Therefore, if the negative pressure is generated in the shared passage 61, air flows from the tip 10A of the shaft 10 toward the shared passage 61 through the hollow part 11, the communication hole 12, the inner space 500, the control passage 501 and the air flow passage 202A. At this time, a pressure detected by the pressure sensor 64 has correlation with the pressure in the hollow part 11. That is, the lower the pressure detected by the pressure sensor 64 is, the lower the pressure in the hollow part 11 becomes. Therefore, the pressure in the tip 10A of the shaft 10 is low. Furthermore, at this time, a flow rate detected by the flow sensor 65 has correlation with the pressure in the hollow part 11. That is, the smaller the flow rate detected by the flow sensor 65 is, the lower the pressure in the hollow part 11 is. Therefore, the pressure in the tip 10A of the shaft 10 is low.

To solve the problem, in the present embodiment, at least one of a case where the pressure detected by the pressure sensor 64 decreases down to a predetermined pressure or less, and a case where the flow rate detected by the flow sensor 65 decreases down to a predetermined flow rate or less, it is determined that the pressure in the hollow part 11 sufficiently decreases, and the linear motion motor 30 moves the shaft 10 upward in the Z-axis direction. Note that the predetermined flow rate is a flow rate at which the pressure in the hollow part 11 decreases to a pressure with which the workpiece W can be picked up, and the predetermined pressure is a pressure to which the pressure in the hollow part 11 decreases and at which the workpiece can be picked up. The predetermined flow rate and the predetermined pressure are obtained beforehand by experiment, simulation or the like.

This pickup processing will be described. FIG. 10 is a flowchart illustrating flow of pickup processing. The present flowchart is executed by a controller 7 every predetermined time. This predetermined time is set in accordance with tact time. Note that a step in which the same processing as the pickup processing illustrated in FIG. 6 is performed is denoted with the same reference numeral or symbol and description is omitted.

In the flowchart illustrated in FIG. 8, if the processing of the step S106 ends, the processing advances to step S501. In the step S501, the pressure sensor 64 detects the pressure, and the flow sensor 65 detects the flow rate. Note that in the present flowchart, in the next step S502, it is determined whether or not the pressure in the hollow part 11 sufficiently decreases, by using both the detected value of the pressure sensor 64 and the detected value of the flow sensor 65, and therefore, in the step S501, both the pressure and the flow rate are detected. However, in the step S501, one of the pressure and the flow rate may be detected, in a case where it is determined whether or not the pressure in the hollow part 11 sufficiently decreases, by using one of the detected value of the pressure sensor 64 and the detected value of the flow sensor 65.

Next, in the step S502, it is determined whether or not the pressure detected by the pressure sensor 64 is the predetermined pressure or less, and whether or not the flow rate detected by the flow sensor 65 is the predetermined flow rate or less. If affirmative determination is made in the step S502, the processing advances to step S107, and if negative determination is made, the processing returns to the step S501. Therefore, the linear motion motor 30 is stopped until the pressure detected by the pressure sensor 64 reaches the predetermined pressure or less and until the flow rate detected by the flow sensor 65 reaches the predetermined flow rate or less. Note that in the step S502, it may be determined one of whether or not the pressure detected by the pressure sensor 64 is equal to or smaller than the predetermined pressure or whether or not the flow rate detected by the flow sensor 65 is equal to or smaller than the predetermined flow rate.

As described above, according to an actuator 1 of the present embodiment, it is determined whether or not the pressure in the hollow part 11 sufficiently decreases, based on the pressure detected by the pressure sensor 64 and/or the flow rate detected by the flow sensor 65. Thereafter, the shaft 10 is moved upward in the Z-axis direction, and hence it is possible to more securely pick up the workpiece W.

DESCRIPTION OF THE REFERENCE NUMERALS AND SYMBOLS 1 actuator
2 housing
10 shaft
10A tip
11 hollow part
20 rotating motor
22 stator
23 rotor
30 linear motion motor
31 stator
32 mover
36 coupling arm
37 strain gauge
50 shaft housing
60 air control mechanism

The invention claimed is:

1. An actuator comprising:
a shaft;
a support part that rotatably supports the shaft;
a linear motion motor including a stator and a mover, movement of the mover in parallel with a central axis of the shaft relative to the stator of the linear motion motor causing the support part and the shaft to move in a direction of the central axis of the shaft;
a connecting member that is at least a part of a member connecting the mover of the linear motion motor and the support part;
a strain gauge provided in the connecting member to detect strain of the connecting member; and
a control device that controls the linear motion motor, based on the strain detected by the strain gauge,
wherein the connecting member includes a first member and a second member that are provided in a shifted manner in a direction of the central axis of the shaft, and
the strain gauge is provided on each of surfaces that are provided on the first member and the second member, respectively, the surfaces facing in the same direction and being parallel to each other and orthogonal to the central axis of the shaft.

2. The actuator according to claim 1, wherein the control device detects a load applied to the shaft based on the strain detected by the strain gauge while the shaft is being moved by the linear motion motor, and stops the linear motion motor in a case where the detected load is equal to or larger than a threshold.

3. The actuator according to claim 2, wherein the shaft includes a hollow part formed on a tip side of the shaft such that an interior of the shaft is hollow,
the actuator further comprises a supply part that supplies a negative pressure to the hollow part, and
the control device supplies the negative pressure from the supply part to the hollow part, after the linear motion motor is stopped, when a workpiece is to be picked up.

4. The actuator according to claim 1, wherein the control device detects a load applied to the shaft based on the strain detected by the strain gauge while the shaft is being moved by the linear motion motor, and sets a speed at which the shaft is moved by the linear motion motor to a lower speed, in a case where the detected load is equal to or larger than a threshold than in a case where the load is less than the threshold, and stops the linear motion motor, in a case where the detected load is equal to or larger than a second threshold indicating a load larger than the threshold.

5. The actuator according to claim 1, wherein the shaft includes a hollow part formed on a tip side of the shaft such that an interior of the shaft is hollow, wherein the actuator further comprises:
- a supply part that supplies a negative pressure to the hollow part;
- a flow sensor provided in a middle of an air passage to detect a flow rate of the air flowing through the air passage, the air passage being a passage through which air sucked from the hollow part when supplying the negative pressure to the hollow part flows; and
- a pressure sensor provided in a middle of the air passage, to detect a pressure in the air passage, and wherein the control device controls the linear motion motor, based on, in addition to the strain detected by the strain gauge, the flow rate detected by the flow sensor and/or the pressure detected by the pressure sensor.

6. The actuator according to claim 5, wherein the control device supplies the negative pressure from the supply part to the hollow part, when a workpiece is to be picked up, and moves the shaft upward in the central axis direction by the linear motion motor, when the flow rate detected by the flow sensor decreases down to a predetermined flow rate or less, and/or when the pressure detected by the pressure sensor decreases down to a predetermined pressure or less.

\* \* \* \* \*